(12) United States Patent
Lee et al.

(10) Patent No.: US 9,141,538 B2
(45) Date of Patent: *Sep. 22, 2015

(54) APPARATUS AND METHOD FOR GENERATING DESCRIPTORS TO TRANSFER DATA TO AND FROM NON-VOLATILE SEMICONDUCTOR MEMORY OF A STORAGE DRIVE

(71) Applicant: Marvell World Trade Ltd., St. Michael (BB)

(72) Inventors: Chi Kong Lee, Fremont, CA (US); Siu-Hung Frederick Au, Fremont, CA (US); Jungil Park, San Jose, CA (US); Hyunsuk Shin, San Diego, CA (US); Wei Xu, Milipitas, CA (US); Jinjin He, San Jose, CA (US); Fei Sun, Irvine, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/132,810

(22) Filed: Dec. 18, 2013

(65) Prior Publication Data
US 2014/0108714 A1    Apr. 17, 2014

Related U.S. Application Data

(63) Continuation-in-part of application No. 13/166,340, filed on Jun. 22, 2011, now Pat. No. 8,868,852.

(Continued)

(51) Int. Cl.
*G06F 12/02* (2006.01)
*G06F 3/06* (2006.01)
(Continued)

(52) U.S. Cl.
CPC ........... *G06F 12/0246* (2013.01); *G06F 3/061* (2013.01); *G06F 3/064* (2013.01); *G06F 3/0659* (2013.01); *G06F 3/0679* (2013.01); *G06F 13/1668* (2013.01); *G11C 16/32* (2013.01)

(58) Field of Classification Search
None
See application file for complete search history.

(56) References Cited

U.S. PATENT DOCUMENTS

| 4,611,278 A | 9/1986 | Boothroyd et al. |
| 5,649,139 A | 7/1997 | Weinreb et al. |

(Continued)

FOREIGN PATENT DOCUMENTS

| CN | 101025720 A | 8/2007 |
| EP | 0305987 A2 | 3/1989 |

(Continued)

OTHER PUBLICATIONS

Webopedia, "RAID", Aug. 10, 2002, pp. 1-2, https://web.arch ive.org/web/20020810160046/http://www.webopedia.com/TERM/R/RAID.html.*

(Continued)

*Primary Examiner* — Edward Dudek, Jr.
*Assistant Examiner* — Christopher D Birkhimer

(57) ABSTRACT

A storage drive including first, second, third, fourth and fifth modules. The first module is configured to control transfer of blocks of data between a host device and the storage drive. The second module is configured to transfer the blocks of data to and from a non-volatile semiconductor memory in the storage drive. The third module is configured to generate a first descriptor, which describes a transfer of blocks of data between the second module and the non-volatile semiconductor memory. The fourth module is configured to, according to the first descriptor, generate second descriptors. Each of the second descriptors corresponds to a respective one of the blocks of data. The fifth module is configured to generate instruction signals based on the second descriptors. The second module is configured to, based on the instruction signals, transfer the blocks of data between the first module and the non-volatile semiconductor memory.

20 Claims, 19 Drawing Sheets

Related U.S. Application Data

(60) Provisional application No. 61/900,104, filed on Nov. 5, 2013, provisional application No. 61/739,386, filed on Dec. 19, 2012, provisional application No. 61/362,251, filed on Jul. 7, 2010.

(51) Int. Cl.
  *G06F 13/16* (2006.01)
  *G11C 16/32* (2006.01)

(56) References Cited

U.S. PATENT DOCUMENTS

| | | | |
|---|---|---|---|
| 5,987,573 | A | 11/1999 | Hiraka |
| 6,493,818 | B2 | 12/2002 | Robertson |
| 6,795,872 | B2 | 9/2004 | Page et al. |
| 6,895,408 | B1 | 5/2005 | Kavantzas |
| 6,943,973 | B1 | 9/2005 | Nunomura et al. |
| 7,007,140 | B2 | 2/2006 | Yoshii et al. |
| 7,054,990 | B1 | 5/2006 | Tamura et al. |
| 7,155,560 | B2 | 12/2006 | McGrew et al. |
| 7,313,649 | B2 | 12/2007 | Tomita et al. |
| 7,363,441 | B2 | 4/2008 | Yim et al. |
| 7,406,576 | B2 | 7/2008 | Asauchi |
| 7,409,492 | B2 | 8/2008 | Tanaka et al. |
| 7,454,670 | B2 * | 11/2008 | Kim et al. ............ 714/710 |
| 7,508,706 | B2 | 3/2009 | Tsuruda |
| 7,546,392 | B2 | 6/2009 | Castille et al. |
| 7,562,183 | B2 | 7/2009 | Kwon |
| 7,600,085 | B2 | 10/2009 | Yokota et al. |
| 7,600,090 | B2 | 10/2009 | Cohen et al. |
| 7,617,515 | B1 | 11/2009 | Laksono |
| 7,664,922 | B2 | 2/2010 | Ohtsuka et al. |
| 8,868,852 | B2 | 10/2014 | Lee et al. |
| 2004/0250009 | A1 * | 12/2004 | Chen et al. ............ 711/103 |
| 2004/0268178 | A1 | 12/2004 | Fredin |
| 2006/0004949 | A1 * | 1/2006 | Van Steenwijk et al. ..... 711/103 |
| 2006/0149890 | A1 | 7/2006 | Gorobets |
| 2006/0161694 | A1 | 7/2006 | Tomozaki |
| 2007/0011396 | A1 | 1/2007 | Singh et al. |
| 2007/0091677 | A1 | 4/2007 | Lasser et al. |
| 2008/0082751 | A1 | 4/2008 | Okin et al. |
| 2008/0209112 | A1 * | 8/2008 | Yu et al. ............ 711/103 |
| 2008/0209154 | A1 * | 8/2008 | Schneider ............ 711/170 |
| 2008/0215802 | A1 * | 9/2008 | Chow et al. ............ 711/103 |
| 2008/0222365 | A1 | 9/2008 | Szewerenko et al. |
| 2008/0320209 | A1 * | 12/2008 | Lee et al. ............ 711/103 |
| 2009/0070520 | A1 | 3/2009 | Mizushima |
| 2009/0132755 | A1 | 5/2009 | Radke |
| 2009/0161429 | A1 | 6/2009 | Chen et al. |
| 2009/0172260 | A1 | 7/2009 | Olbrich et al. |
| 2009/0265506 | A1 | 10/2009 | Yim |
| 2011/0082985 | A1 | 4/2011 | Haines et al. |
| 2012/0011298 | A1 | 1/2012 | Lee et al. |
| 2012/0159052 | A1 | 6/2012 | Lee et al. |
| 2013/0024751 | A1 | 1/2013 | Yang |
| 2014/0195727 | A1 | 7/2014 | Xu et al. |
| 2015/0039817 | A1 | 2/2015 | Lee et al. |

FOREIGN PATENT DOCUMENTS

| | | |
|---|---|---|
| EP | 0578013 A1 | 1/1994 |
| WO | WO 2008/096968 | 8/2008 |
| WO | WO-2012006062 A1 | 1/2012 |
| WO | WO-2014100362 A1 | 6/2014 |
| WO | WO-2014144043 A1 | 9/2014 |

OTHER PUBLICATIONS

Webopedia, Interruot:, Aug. 6, 2002, pp. 1-2, https://web.archive.org/web/20020806203437/http://www.webopedia.com/TERM/I/interrupt.html.*
Webopedia, "Queue", Aug. 10, 2002, pp. 1-2, https://web.archive.org/web/20020810034508/http://www.webopedia.com/TERM/Q/queue.html.*
Webopedia, "Instruction", Apr. 5, 2001, pp. 1-2, https://web.archive.org/web/20010405165609/http://www.webopedia.com/TERM/I/instruction.html.*
Webopedia, "Page", Apr. 11, 2001, pp. 1-2, https://web.archive.org/web/20010411032818/http://www.webopedia.com/TERM/p/page.html.*
PCT International Search Report and the Written Opinion of the Searching Authority, Mar. 27, 2014.
Notification of Transmittal of the International Search Report and the Written Opinion of the International Searching Authority, or the Declaration dated Sep. 30, 2011 in reference to PCT/US2011/042124.
International Search Report for PCT Application No. PCT/US2011/042124 mailed Sep. 30, 2011; 4 pages.
Written Opinion for PCT Application No. PCT/US2011/042124 mailed Sep. 30, 2011; 6 pages.
Webopedia, "Parallel", Aug. 15, 2002, pp. 1-2, https://web.archive.org/web/20020815175718/http://www.webopedia.com/TERM/P/parallel.html.
Webopedia, "Error Detection", Aug. 9, 2002, pp. 1-2, https://web.archive.org/web/20020809135046/http://www.webopedia.com/TERM/E/error_detection.html.
International Search Report for PCT Application No. PCT/US2013/076437 mailed Mar. 27, 2014; 4 pages.
International Search Report for PCT Application No. PCT/US2014/028286 mailed Aug. 6, 2014; 4 pages.
Chinese Office Action for related Chinese Application No. 201180038435.X dated Feb. 15, 2015; 15 pages.

* cited by examiner

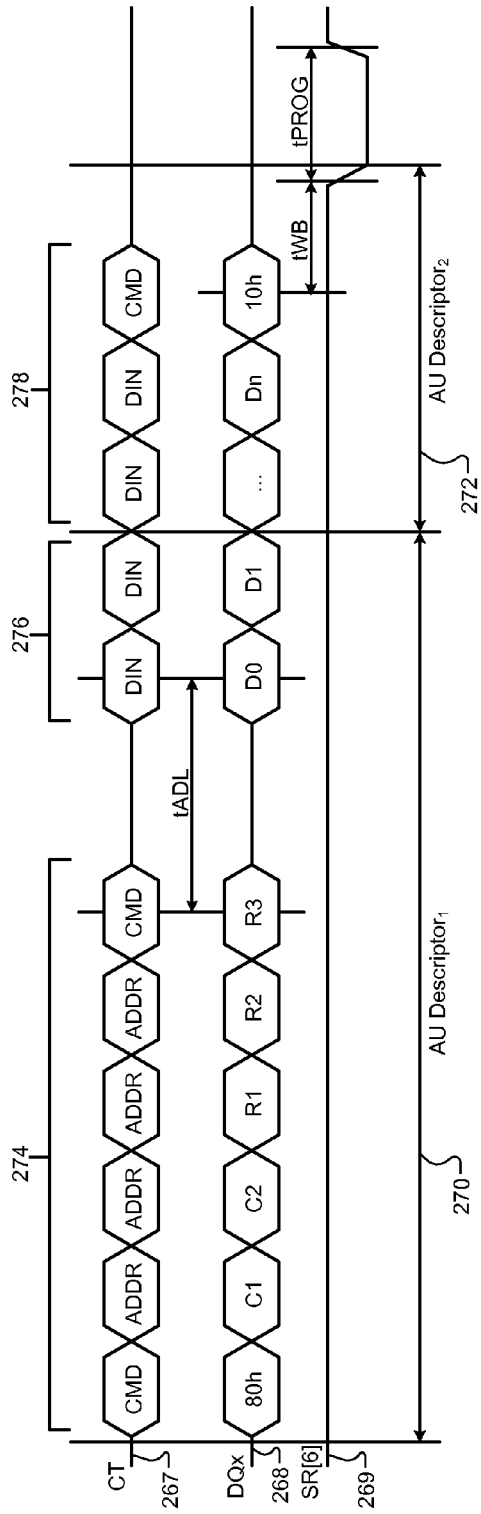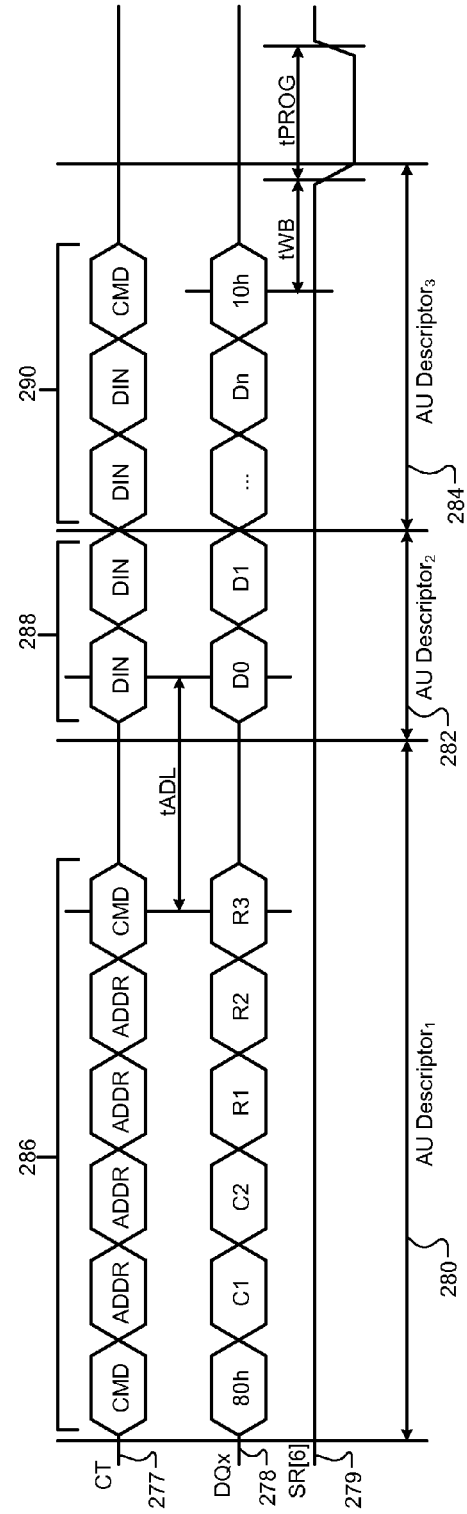

Control Rows with Control Fields

| Row 0 | | | |
|---|---|---|---|
| Row 1 | | | |
| Row 2 | | | |
| Row 3 | PRMT3 | PRMT2 | PRMT1 | PRMT0 |
| Row 4 | PRMT7 | PRMT6 | PRMT5 | PRMT4 |
| ... | | | |
| Row 66 | PRMT7 | PRMT6 | PRMT5 | PRMT4 |

FIG. 22

| | | | | | | | | | | | |
|---|---|---|---|---|---|---|---|---|---|---|---|
| Row 0 | RSVD | PRMT_ROW_NUM | SRC_LEN | | | | | | | | |
| Row 1 | SRC_PTR | | | | | | | | | | |
| | DST_PTR | | | | | | | | | | |
| Row 2 | RSVD | DF_SEL | SC7 | SC6 | SC5 | SC4 | SC3 | SC2 | SC1 | SC0 | |
| | RSVD | SC9 | SC8 | | | | | | | | |

| RSVD | DES_FIFO_ADDR_WRAPPED | DGE_ERR_CODE | DGE_GEN_DES_CNT | DES_FIFO_ADDR |

APPARATUS AND METHOD FOR GENERATING DESCRIPTORS TO TRANSFER DATA TO AND FROM NON-VOLATILE SEMICONDUCTOR MEMORY OF A STORAGE DRIVE

CROSS-REFERENCE TO RELATED APPLICATIONS

The present disclosure is a continuation-in-part Application of U.S. patent application Ser. No. 13/166,340 filed on Jun. 22, 2011 (now U.S. Pat. No. 8,868,852 issued on Oct. 21, 2014). This disclosure claims the benefit of U.S. Provisional Application No. 61/900,104, filed on Nov. 5, 2013 and U.S. Provisional Application No. 61/739,386, filed on Dec. 19, 2012. U.S. patent application Ser. No. 13/166,340 claims the benefit of U.S. Provisional Application No. 61/362,251, filed on Jul. 7, 2010. The disclosures of the above applications are incorporated herein by reference in their entirety.

FIELD

The present disclosure relates to non-volatile semiconductor memory access systems, and more particularly to data transfer control systems for non-volatile semiconductor memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A non-volatile semiconductor memory (NVSM) drive (e.g., a flash drive) includes NVSM and operates based on a size of a page of data. For example, data transferred to and from the NVSM is grouped into data sets. Each of the data sets has a length equal to the length of one or more pages of data. A page of data may have a length of, for example, 8 kilobytes (KB).

A NVSM drive may include, for example, an NVSM interface, a buffer managing module, an error correction code (ECC) module, an interface management module and a NVSM control module. The NVSM interface may communicate with a host. Data is transferred between the NVSM interface and the host. The buffer managing module receives data from the host prior to being stored in the NVSM and receives data from the NVSM prior to being transferred to the host. The ECC module encodes data provided to the NVSM and decodes data received from the NVSM. The interface management module controls data transfers between the ECC module and the NVSM.

The NVSM control module generates descriptors in response to access request signals received from the host. The descriptors may indicate, for example, whether a read operation or a program (i.e. write) operation is to be performed, the amount of data to be transferred, and the addresses to access in the NVSM. The ECC module and the interface management module are operated based on the descriptors.

The interface control module communicates with the NVSM via multiple channels (e.g., 8 channels per NVSM chip) and includes a first-in-first-out (FIFO) register for each of the channels. The FIFO registers are accessed sequentially during read and program operations. The size of each of the FIFO registers is equal to the size of one or more pages of data.

During a program operation, the ECC module transfers data in a page-based format to the interface control module prior to being stored in the NVSM. The ECC module may transfer one or more pages (M pages) of data to each of the FIFO registers, where M is an integer greater than or equal to 1. The number of pages the ECC module transfers to each of the FIFO registers is dependent on the page format of that NVSM drive. For each set of M pages transferred a single descriptor is generated.

For example, if the ECC module is operating in an NVSM drive with a single page format, 1 page of data is transferred to each of the FIFO registers. In this example, the size of each of the FIFO registers is equal to the size of 1 page of data. If the ECC module is operating in an NVSM drive with a dual page format, then 2 pages of data are transferred to each of the FIFO registers and the size of each of the FIFO registers is equal to the size of 2 pages of data. The M pages of data are transferred to a current FIFO register prior to transferring data to a next (or subsequent) FIFO register. The above-described data transfers are performed in reverse for a read operation.

Because data is not transferred to a next FIFO register until a current FIFO register receives the M pages of data, data transfer delays can result. These delays may be experienced at one or more of the FIFO registers and can increase with higher order page formats. The order of a page format refers to the number of pages transferred during a single data transfer event. A data transfer event refers to transferring data to or from one of the channels of the NVSM. For example, in a NVSM drive with a 2-page format, if a "bottleneck" arises at a first FIFO register due to speed differences between the ECC module and a first channel, delays can arise at the first FIFO register and at all subsequent FIFO registers. Since two pages of data are transferred to a single FIFO register, a second page of data can be delayed when a first page of data is delayed. Also, delays in transferring the second page of data to the first FIFO register delays transfers of data to FIFO registers subsequent to the first FIFO register.

SUMMARY

A storage drive is provided and includes first, second, third, fourth and fifth modules. The first module is configured to control transfer of blocks of data between a host device and the storage drive. The second module is configured to transfer the blocks of data to and from a non-volatile semiconductor memory in the storage drive. The third module is configured to generate a first descriptor, which describes a transfer of blocks of data between the second module and the non-volatile semiconductor memory. The fourth module is configured to, according to the first descriptor, generate second descriptors. Each of the second descriptors corresponds to a respective one of the blocks of data. The fifth module is configured to generate instruction signals based on the second descriptors. The second module is configured to, based on the instruction signals, transfer the blocks of data between the first module and the non-volatile semiconductor memory.

In other features, the fourth module is configured to: access a template; update fields in the template based on parameters in the first descriptor; and generate the second descriptors according to the template. In other features, the fourth module is configured to replace values of the fields of the template with the parameters.

In other features, the parameters include control parameters to control the non-volatile semiconductor memory. The fourth module is configured to generate some of the second descriptors to include the control parameters and others of the second descriptors to not include the control parameters.

In other features, the template includes redundant array of independent disk values for the second descriptors. The fourth module is configured to generate the second descriptors to respectively include the redundant array of independent disk values. The second module is configured to, based on the redundant array of independent disk values, transfer the blocks of data between the first module and the non-volatile semiconductor memory.

In other features, the templates include channel values and memory device values for each of the second descriptors. The second module is configured to transfer portions of the data on respective channels to and from the non-volatile semiconductor memory according to the channel values and the memory device values.

In other features, the first descriptor is a firmware descriptor. The second descriptors are hardware descriptors.

In other features, the third module is configured to execute firmware to generate the first descriptor. The fourth module includes an electronic circuit, where the electronic circuit is configured to generate the second descriptors according to the first descriptor.

In other features, a method is provided and includes: controlling transfer of blocks of data between a host device and a storage drive; generating a first descriptor to transfer the blocks of data to or from a non-volatile semiconductor memory in the storage drive; according to the first descriptor, generating second descriptors, where each of the second descriptors corresponds to a respective one of the blocks of data; generating instruction signals based on the second descriptors; and based on the instruction signals, transferring the blocks of data between the host device and the non-volatile semiconductor memory.

In other features, the method further includes: accessing a template; updating fields in the template based on parameters in the first descriptor; and generate the second descriptors according to the template.

In other features, the method further includes: replacing values of the fields of the template with the parameters, where the parameters include control parameters to control the non-volatile semiconductor memory; generating some of the second descriptors to include the control parameters; and generating others of the second descriptors to not include the control parameters.

In other features, the first descriptor is a firmware descriptor; and the second descriptors are hardware descriptors. In other features, the method further includes: executing firmware to generate the first descriptor; and generating, via an electronic circuit, the second descriptors according to the first descriptor.

In other features, a control system is provided and includes a control module configured to control data transfer events of blocks of data between an interface management module and a non-volatile semiconductor memory based on at least two descriptors for each one of the data transfer events. The non-volatile semiconductor memory is prepared for a read event or a program event of the data transfer event. The interface management module and the non-volatile semiconductor memory are configured to operate within a solid-state memory drive. A command management module is configured to generate a parameter signal based on the at least two descriptors. The interface management module is configured to generate instruction signals based on the parameter signal and transmit the instruction signals to the non-volatile semiconductor memory to perform the read event or the program event.

In other features, each of the data transfer events includes transferring a page of data. A size of the page of data is equal to a size of at least two of the blocks of data. The at least two of the blocks of data is transferred based on a respective one of the at least two descriptors.

In other features, each of the data transfer events includes transferring pages of data. In other features, the interface management module is configured to generate trigger instructions sets for each of the data transfer events to initiate transfer of the blocks of data.

In other features, a number of the at least two descriptors is equal to a number of trigger instruction sets generated for each of the data transfer events. In other features, the interface management module is configured to generate the trigger instruction sets prior to preparing periods for each of the data transfer events. Subsequent to the preparing periods, the interface management module is configured to generate read instruction sets or program instruction sets. Each of the data transfer events includes at least one of the trigger instruction sets and at least one of the read instruction sets or the program instruction sets.

In other features, each of the at least two descriptors indicates allocation block sizes, addresses of the non-volatile semiconductor memory, and whether the data transfer events are read, program or erase events.

In other features, bits of the parameter signal indicate an amount of data to transfer, addresses of the non-volatile semiconductor memory and whether the data transfer events are read, program or erase events.

In other features, the parameter signal is a first parameter signal. The command management module is configured to generate a second parameter signal based on the at least two descriptors. An error correction code module is configured to transfer blocks of data to and from the interface management module based on the second parameter signal In other features, the interface management module includes first-in-first-out registers. The error correction code module is configured to spread the blocks of data to the first-in-first-out registers. The size of each of the first-in-first-out registers is less than a size of a page of data.

In other features, a solid-state memory drive is provided and includes the control system, a buffer managing module and an error correction code module. The buffer managing module is configured to receive host data sectors from a host in communication with the solid-state memory drive, generate first drive data sectors based on the host data sectors, receive second drive data sectors, and transmit host data sectors to the host. The error correction code module is configured to transfer the first drive data sectors to from the buffer managing module to the interface management module and transfer the second drive data sectors from the interface management module to the buffer managing module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 11 is a timing diagram illustrating a program event with the same number of descriptors as allocation blocks transferred according to the present disclosure;

FIG. 12 is a timing diagram illustrating a program event with more descriptors than allocation blocks transferred according to the present disclosure;

FIG. 21 illustrates an example of a firmware descriptor generated by a NVSM control module according to the present disclosure;

FIG. 22 illustrates examples of control rows for the firmware descriptor of FIG. 21.

FIG. 23 illustrates an example of a status register according to the present disclosure;

DESCRIPTION

In the following description, the term "non-volatile semiconductor memory (NVSM)" may refer to phase change memory (PCM), electrically erasable programmable read-only memory (EEPROM), read only memory (ROM) and/or random access memory (RAM). A couple of examples of EEPROM are NAND flash memory and NOR flash memory.

Also, in the following description the term "host" may refer to a device that transfers data to and/or accesses data from a NVSM drive. A NVSM drive may be a flash drive, a universal serial bus (USB) drive, a solid-state memory drive, etc.

As a few examples, a host may refer to a computer, a camera, a handheld device, a portable device, a cellular phone, a printer, a personal data assistant, an electronic note pad, a television, a display, an appliance, a monitoring system, etc. Examples of computers are a desktop computer, a laptop computer, an electronic note pad, etc. Examples of appliances are a washer, a dryer, a refrigerator, etc. A NVSM drive includes NVSM and may not include a rotating magnetic storage medium, such as a hard disk drive platter. Examples of monitoring systems include burglar monitors, smoke detection systems, baby monitors, etc.

In addition, various system elements, such as modules, network devices, and circuit components are disclosed herein. Examples of arrangements of the system elements are disclosed and include adjacent elements and non-adjacent elements. The adjacent elements are shown as being directly connected to each other. The non-adjacent elements are shown as being indirectly connected to each other.

Figure 1:
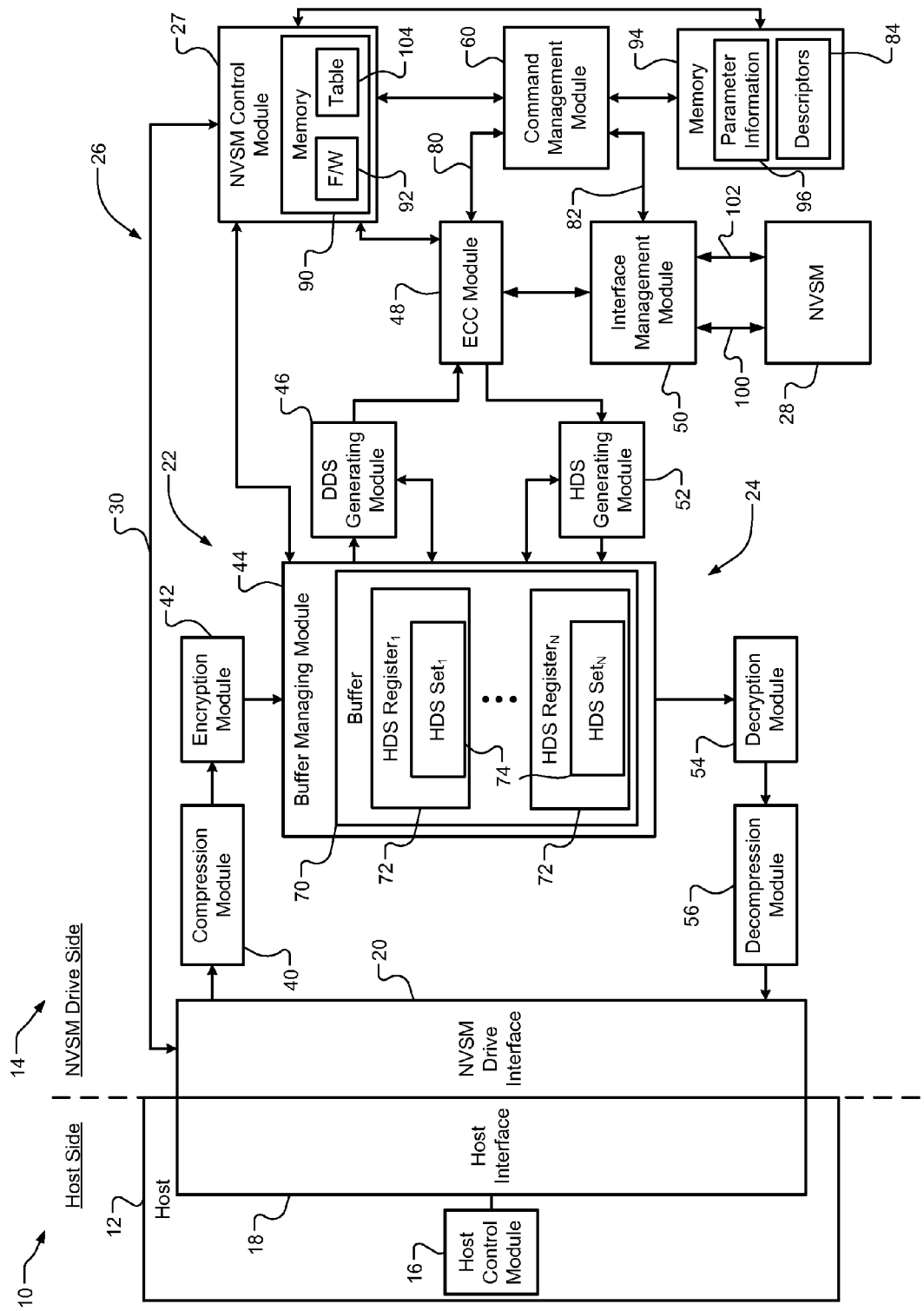
FIG. 1 is a functional block diagram of a NVSM storage system incorporating an interface management control system according to the present disclosure.

FIG. 1 shows a non-volatile semiconductor memory (NVSM) storage system 10. The NVSM storage system 10 includes a host 12 (or host side) and a NVSM drive 14 (or NVSM side). The host 12 includes a host control module 16 and a host interface 18. The NVSM drive 14 communicates with the host 12 via a NVSM drive interface 20. The NVSM drive 14 includes the NVSM drive interface 20, a receive path 22, a transmit path 24, an interface management control system 26 and a NVSM 28. The NVSM drive interface 20 communicates with the host interface 18. The receive and transmit paths 22, 24 transfer data between the NVSM drive interface 20 and the NVSM 28. The interface management control system 26 includes a NVSM control module 27. The NVSM control module 27 controls data transfers to and from the NVSM 28.

The interface management control system 26 operates based on predetermined, selected, and/or determined size(s) of allocation blocks of data (or allocation units (AUs)). This is unlike traditional NVSM drives that operate based on a single fixed block size. In a traditional NVSM, the single block size is equal to the size of a page of data.

In the present disclosure, an allocation block of data refers to an amount of data (or size boundary) set by the NVSM drive 14 and used to transfer data between devices and/or modules of the NVSM drive 14. Each data transfer event to and from the NVSM 28 includes one or more allocation blocks of data. The data transfer events may be program events or read events. The sizes of the allocation blocks may be the same or different: for different read events; for different program events; and/or between read events and program events. The sizes of the allocation blocks may be determined, set and/or adjusted by the NVSM control module 27. Allocation blocks, allocation block sizes and the transfer of allocation blocks are further described below.

The host control module 16 transmits and receives host data to and from the NVSM drive 14 via the host interface 18. This may include read, write (or program), and erase access events. The host 12 may generate HDSs based on a received data object and/or request host data sectors (HDSs) from the NVSM drive 14. A HDS may be the smallest length data element that is transmitted from the host 12 to the NVSM drive 14. The HDSs are transmitted between respective ports of the interfaces 18, 20. The interfaces 18, 20 may be, for example, serial advanced technology attachment (SATA) interfaces, small computer system interfaces (SCSIs), serial-attached SCSIs (SASs), fiber channel interfaces, universal serial bus (USB) interfaces, etc.

The host control module 16 may also generate access request signals 30, such as data program signals, data read signals, data erase signals, etc. The access request signals 30 may be received by a NVSM control module 27 and/or by other modules of the NVSM drive 14 via the NVSM drive interface 20. The NVSM control module 27 controls access to the NVSM 28 based on the access request signals 30. The NVSM drive 14 receives the HDSs via the NVSM drive interface 20. The NVSM control module 27 may access and/or request drive data sectors (DDSs) from the NVSM 28 based on the access request signals 30.

The receive path 22 includes a compression module 40, an encryption module 42, a buffer managing module 44, a drive data sector (DDS) generating module 46, an error correction code (ECC) module 48, an interface management module 50 and the NVSM 28. The transmit path 24 includes the NVSM 28, the interface management module 50, the ECC module 48, a HDS generating module 52, the buffer managing module 44, a decryption module 54 and a decompression module 56. The buffer managing module 44 and the DDS and HDS generating modules 46, 52 may be combined to form a single module. The interface management control system 26 includes the NVSM control module 27, a command management module 60, the ECC module 48, and the interface management module 50. Modules of the NVSM drive 14 may be referred to as a NVSM storage system.

The NVSM drive interface 20 may receive a single data stream or multiple concurrent parallel data streams from the host interface 18. The data streams may be transferred to the compression module 40. Multiple concurrent parallel data streams may be received when the host and NVSM interfaces 18, 20 are, for example, SAS interfaces.

The compression module 40 compresses HDSs received from the host interface 18 when possible and prior to being received by the buffer managing module 44. The compression is performed on HDSs that are the same length as the HDSs received from the host interface 18. The compression module 40 may use lossy and/or lossless compression methods. Lossy compression and decompression provides data that is close but not the same as the original data after compression and decompression. Lossless compression and decompression provides reconstruction of the same data as the original subsequent to compression and decompression. Lossless data compression includes detecting repeating bit patterns and removing the redundancy.

The compression module 40 compresses host data sectors (HDSs) received from the host 12 when possible. The HDSs may be uncompressed, partially compressed, and/or fully compressed when received. An HDS may be the smallest length data element that is transmitted from the host 12 to the NVSM drive 14. Certain HDSs may not be compressible, for example, when lossless compression is used and a corresponding data pattern does not include redundancy.

The encryption module 42 encrypts the compressed HDSs. The encryption module 42 encrypts data received from the compression module 40. The encryption may include one or more public and private keys. The encryption may also include one or more keys that are specific to the NVSM drive 14 or a component of the NVSM drive 14, such as a key specific to the NVSM control module 27 and/or the NVSM 28.

The buffer managing module 44 stores the HDSs in a buffer 70 and forwards the HDSs to the DDS generating module 46. The buffer 70 may include volatile memory, such as RAM, dynamic RAM (DRAM), and/or static RAM (SRAM). The buffer managing module 44 may collect and store one or more HDSs prior to storage in the NVSM 28.

The buffer managing module 44 may: convert received DDSs from the encryption module 42 to HDSs when possible; receive HDSs from a component downstream from the buffer managing module 44 (between the buffer managing module 44 and the NVSM 28); and/or transfer HDSs to the decompression module 56. Each of the DDSs may be larger than or equal to the size of the HDSs. Decompressed HDSs are transmitted to the host 12. The buffer managing module 44 may combine and store the compressed and/or encrypted HDSs in a predetermined order regardless of the order in which the HDSs are received.

For example, HDSs may be received in a numerical order or may be received in a different order. Sequentially received HDSs may be stored in different HDS registers 72 to allow for reordering of the HDSs in a numerical or predetermined order. Thus, HDS registers 72 may be used to provide HDS sets 74 for respective DDSs (HDS registers 1-N and HDS sets 1-N are shown). As a HDS register is filled and/or a predetermined DDS length limit is met, an HDS set may be released from the buffer managing module 44 and passed to the DDS generating module 46. A predetermined DDS length limit is met, for example, when no further HDSs can be and/or are to be combined with other HDSs of a current DDS.

The DDS generating module 46 generates DDSs based on the combined and/or stored HDS(s) in the HDS registers 72 and based on HDS and DDS information. The DDS generating module 46 converts the HDSs to DDSs prior to storage in the NVSM 28. The HDS and DDS information may be received from the buffer managing module 44. The HDS and DDS information may include the HDS information bits and DDS information, such as DDS length, DDS bit slot availability, etc.

The DDS generating module 46 may generate each DDS to have the same bit length. Nuisance data refers to data that is added to one or more HDSs such that a generated DDS is of a predetermined bit length. Compressed HDSs may have different bit lengths. Different amounts of nuisance data is added to combine compressed HDSs to generate DDSs of equal length. The NVSM control module 27 prevents an HDS from being split between two DDSs by adding the nuisance data. Instead of storing portions of a HDS with two or more other HDSs, nuisance data is attached. The nuisance data may include, for example, all 0's, all 1's, null states, and/or redundant data to minimize programming and/or processing of the NVSM control module 27.

The ECC module 48 and the interface management module 50 may operate based on parameter signals from the command management module 60. The command management module 60 generates a first parameter signal 80 and a second parameter signal 82 based on commands and/or job descriptors 84 (referred to collectively as descriptors) received from the NVSM control module 27.

During a data transfer event, the NVSM control module 27 or one of the other modules of the NVSM drive 14 receives the access request signals 30. The NVSM control module 27 may include or access a first non-volatile memory 90. The first non-volatile memory 90 stores firmware 92 executed by the NVSM control module 27. In executing the firmware 92, the NVSM control module 27 generates the descriptors 84 based on the access request signals 30. The descriptors 84 are stored in a second non-volatile memory 94. The second non-volatile memory 94 may be part of the command management module 60 or separate from the command management module 60, as shown. The second non-volatile memory 94 may store the descriptors 84 and parameter information 96 for interpreting the descriptors 84 received from the NVSM control module 27 to determine parameters and generate the parameter signals 80, 82, as described below.

In generating the descriptors 84, the NVSM control module 27 may determine: a size of an allocation block of data based on the access request signals, tables relating sizes of blocks of data to other parameters, an application of use, etc. A size of an allocation block of data may be referred to as an allocation unit (AU) size or an allocation block size. An application of use may indicate, for example, a type of host, a type of NVSM drive, and speeds of the host and the NVSM drive. The NVSM control module 27 generates the descriptors 84 to indicate the allocation block sizes. The descriptors 84 may each include: the allocation block sizes; buffer register locations; NVSM addresses; NVSM channel identifiers (IDs); NVSM device identifiers (e.g., memory chip IDs); data formats; amounts of data to transfer; type of operation bits (e.g., read, program, and/or erase bits); etc.

Each of the allocation block sizes may be page based, sub-page based, or non-page based. An allocation block size is page based when the allocation block size is equal to the size of one or more pages of data. As an example a single page of data may be equal to 8 kilobytes (KB). Other example page sizes are 4 KB, 16 KB, and 32 KB. An allocation block size is sub-page based when the size of two or more allocation blocks of data is equal to the size of 1 page of data. An allocation block size is non-page based when the allocation block size is not an integer multiple of 1 page and an integer multiple of the allocation block size is not equal to the size of 1 page of data. An allocation block may include any amount of data.

Figure 7:
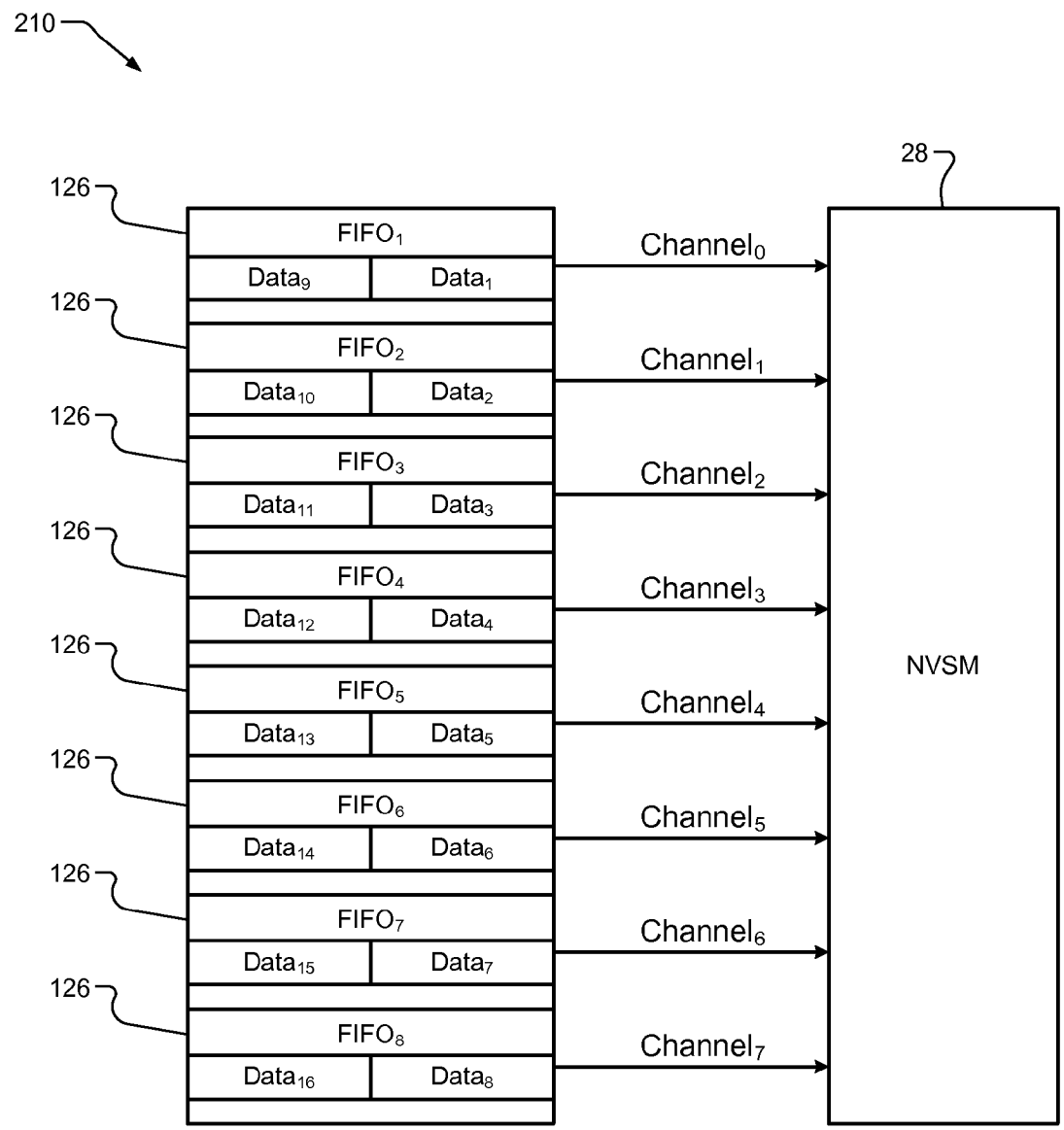
FIG. 7 is a functional block diagram of a portion of an interface management control system illustrating multi-page program events with page-sized transfers according to the present disclosure.
Figure 14:
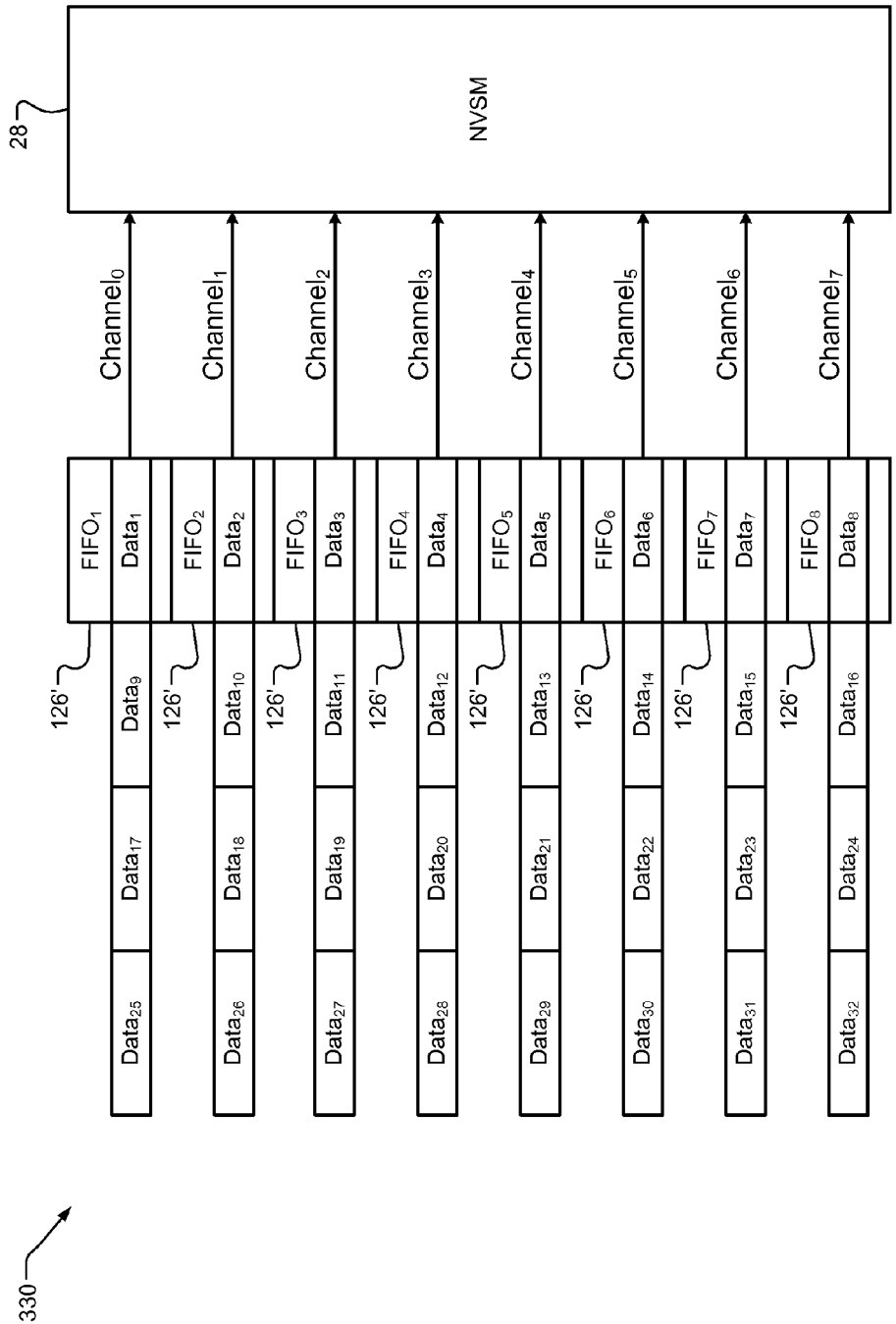
FIG. 14 is a functional block diagram of a portion of an interface management control system illustrating an allocation block based program events with allocation block sized transfers according to the present disclosure.
Figure 15:
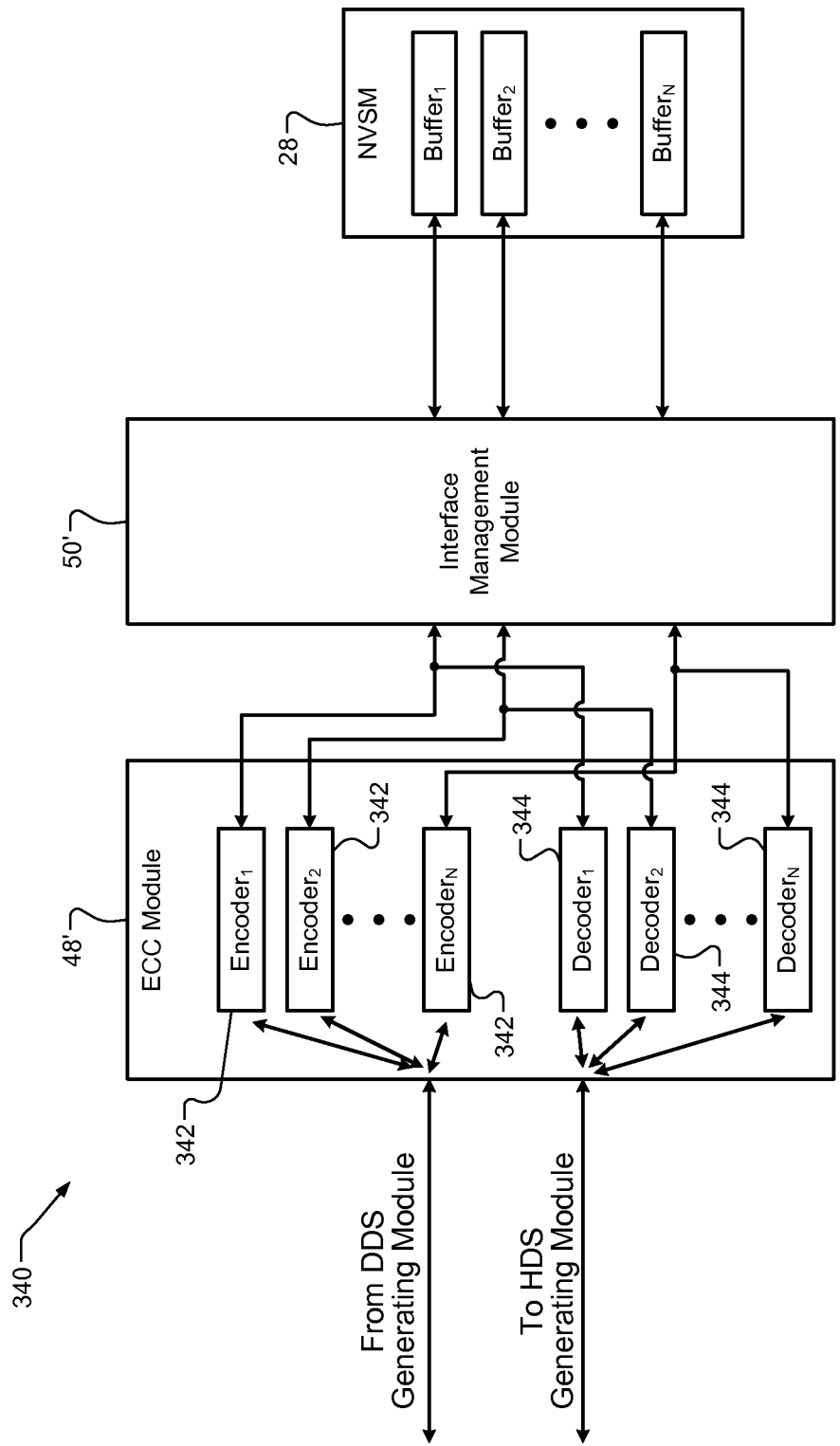
FIG. 15 is a functional block diagram of a portion of an interface management control system incorporating multiple encoders and decoders according to the present disclosure.

Allocation blocks of data may be transferred to and from channels 100 of the NVSM 28. A transfer of one or more allocation blocks of data ("blocks of data") may be referred to as a data transfer event. Data transfer events may also occur, for example, between devices in series with and/or communicating with the channels. Example data transfer events between example devices and/or modules are shown in FIGS. 7, 14 and 15.

The command management module 60 may determine: allocation block sizes, an ECC correction power (number of bit errors per data block corrected); buffer register locations; NVSM addresses; data formats; amounts of data to transfer; redundant array of independent disks (RAID) operations; read, program, and/or erase bits; etc. based on the descriptors 84. The command management module 60 executes the descriptors 84 and/or generates the first and second parameter signals 80, 82 based on the descriptors 84.

The first parameter signal 80 may include: an ECC correction power bit; buffer register location bits; NVSM address bits; data format bits; amount of data to transfer bits; a number of blocks of data to transfer bits; redundant array of independent disks (RAID) operation bits; read, program, and/or erase bits; etc. The second parameter signal 82 may include: NVSM address bits; allocation block size bits; a number of blocks of data to transfer bits; read, program, and/or erase bits; etc.

The ECC module 48 performs error correction and encodes and decodes the DDSs and data received from the NVSM 28. The ECC module 48 transfers DDSs to and receives DDSs from the interface management module 50 based on the first parameter signal 80. The interface management module 50 accesses the NVSM 28 based on the second parameter signal 82. The interface management module 50 transmits instruction signals 102 to the NVSM 28 to control access to the NVSM 28. The NVSM 28 transmits data signals to the interface management module 50 and/or receives data signals from the interface management module 50 via the channels 100 based on and/or according to the instruction signals 102. The instruction signals 102 may include, for example, a cycle type signal CT, a timing strobe signal DQx, and a status register bit signal SR[6], examples of which are shown in FIGS. 4-6 and 8-13.

The ECC module 48 and/or other ECC modules may be connected: between the compression module 40 and the encryption module 42 to encode compressed HDSs; between the encryption module 42 and the buffer managing module 44 to encode encrypted HDSs; between the buffer managing module 44 and the DDS generating module 46; and/or between the DDS generating module 46 and the NVSM 28 as shown. The DDSs are then stored in the NVSM 28.

The ECC module 48 may use one or more ECC methods to prevent errors when writing data to and reading data from the NVSM 28. Parity bits may be generated and added to the DDSs prior to being stored in the NVSM 28 and/or may be stored separate from the DDSs in the NVSM 28.

The interface management module 50 may store the DDSs at physical block addresses (PBAs) in the NVSM 28. The PBAs of the DDSs may be stored in one or more locations and acquired by the interface management module 50 when accessing storage locations of the DDSs in the NVSM 28. For example, the PBAs may be stored in the first non-volatile memory 90 and/or in the NVSM 28. The first non-volatile memory 90 or the NVSM 28 may store a mapping table 104 of the PBAs, which may be based on an allocation block size. As an example, PBA(s) associated with an allocation block may be identified in the mapping table 104. This is different than storing the PBAs based on a size of a page of data. The allocation block size may be set based on or independent of a size of a page of data. Since the firmware 92 stores the PBAs based on allocation block size, a change in allocation block size does not require a change in firmware instructions, but rather simply an allocation block size setting adjustment. The mapping table 104 may relate logical block addresses (LBAs) to PBAs. The mapping table 104 may be accessed by any of the modules in the receive and transmit paths 22, 24.

The interface management module 50 may access DDSs in the NVSM 28 prior to forwarding the DDSs to the ECC module 48. The ECC module 48 may decode DDSs accessed from the NVSM 28 based on access command signals and/or parity information associated with the DDSs. The access command signals may be generated by the NVSM control module 27 and/or the command management module 60 and include the first parameter signal 80. The access command signals may include one or more PBAs. The access command signals may be generated by the NVSM control module 27 and based on LBAs and/or access request signals received from the host 12. The HDS generating module 52 accesses or receives the DDSs from the ECC module 48 based on data request signals received, for example, from the buffer managing module 44.

The HDS generating module 52 and/or the buffer managing module 44 separate the received DDSs into HDSs. The HDS generating module 52 generates one or more HDSs based on decrypted DDSs received from the ECC module 48. The HDS generating module 52 generates the HDSs based on the HDS identification information and/or a data request signal. The data request signal may include one or more LBAs. The decryption module 54 decrypts decoded DDSs from the ECC module 48. The keys used by the encryption module 42 may be shared, accessed and/or generated by the decryption module 54.

Although the modules of the receive and transmit paths 22, 24 are shown in a particular order, they may be rearranged in a different order. For example, the encryption module 42 may be located upstream from the compression module 40. In other words, the encryption module 42 may be connected between the NVSM drive interface 20 and the compression module 40. As another example, the decryption module 54 may be connected between the NVSM drive interface 20 and the decompression module 56.

The following FIGS. 2-11 illustrate other examples of implementations of the NVSM storage system 10.

Figure 2:
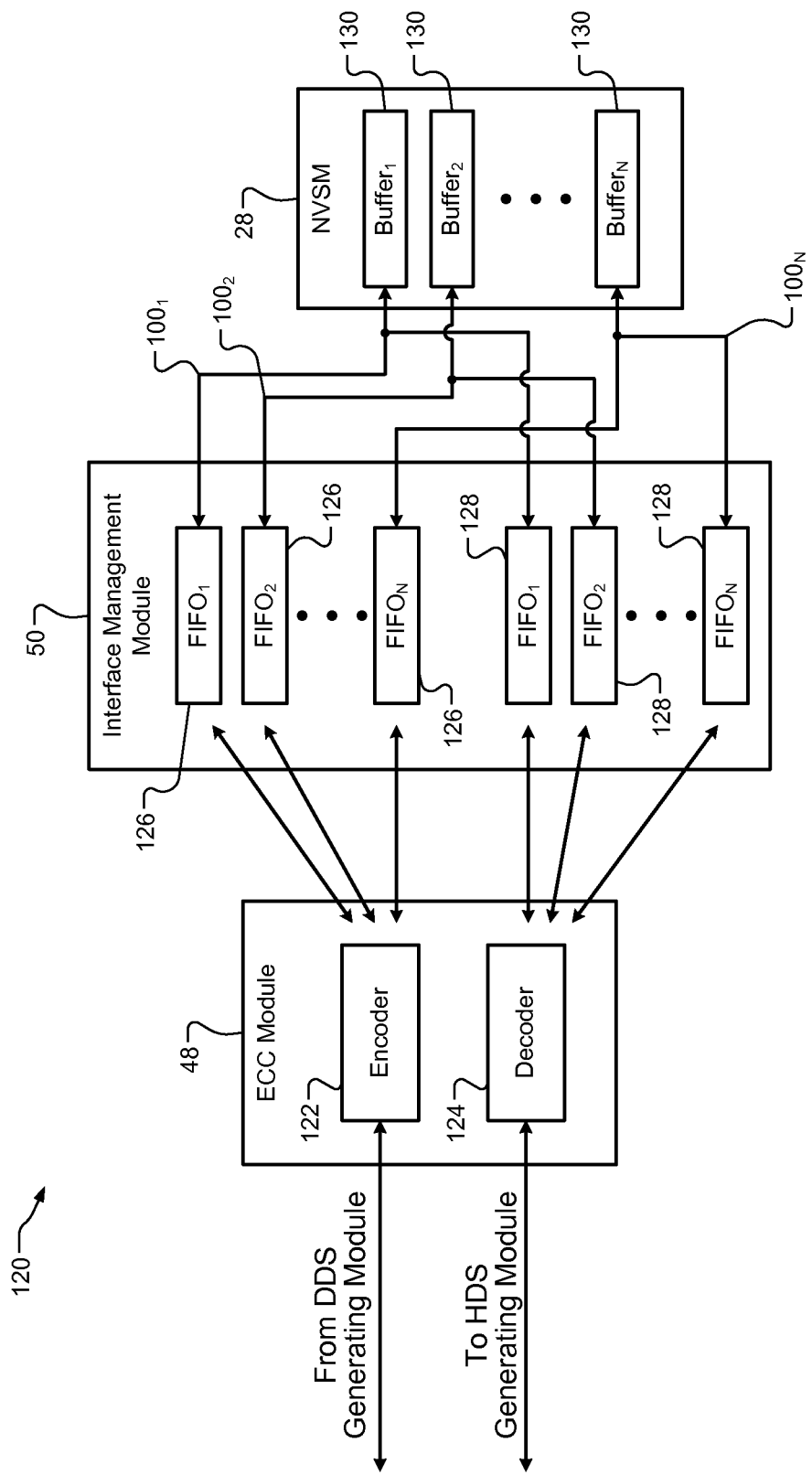
FIG. 2 is a functional block diagram of a portion of the interface management control system according to the present disclosure.

FIG. 2 shows a portion 120 of the interface management control system 26 including the ECC module 48, the interface management module 50, and the NVSM 28. The ECC module 48 includes an encoder 122 and a decoder 124. The encoder 122 encodes DDSs and forwards the encoded DDSs in the form of allocation blocks of data to the interface management module 50. The encoder 122 may combine an integer multiple of DDSs to form an allocation block of data. The decoder 124 decodes allocation blocks of data from the interface management module 50 to generate DDSs.

The interface management module 50 includes, for the example shown, a first series of FIFO registers 126 and a second series of FIFO registers 128. The first series of FIFO registers 126 are associated with program events and are used to buffer data transferred from the ECC module 48 to the NVSM 28. The second series of FIFO registers 128 are associated with read events and are used to buffer data transferred from the NVSM 28 to the ECC module 48. Although a FIFO register series is shown for each of the encoder 122 and decoder 124, the interface management module 50 may include a single series of FIFO registers, which are shared by the encoder 122 and the decoder 124. The first and second FIFO registers 126, 128 may include, for example, SRAM or other suitable memory devices.

The size of each of the FIFO registers 126, 128 may be greater than or equal to an allocation block size set by the NVSM control module 27. The size of each of the FIFO registers 126, 128 may be greater than, equal to, or less than the size of a page of data, as the allocation block size may be greater than, equal to, or less than the size of a page of data. An example of FIFO registers sized equal to a size of a page of data is shown in FIG. 7. An example of FIFO registers sized less than a size of a page of data is shown in FIG. 14.

The interface management module 50 communicates with the NVSM 28 over the channels $100_{1-N}$. Each of the FIFO registers 126, 128 is associated with a respective one of the channels $100_{1-N}$. The FIFO registers 126, 128 temporarily store data prior to being stored in the NVSM 28 and/or prior to being transferred to the buffer managing module 44 (shown in FIG. 1). The NVSM 28 may include buffers 130 for each of the channels $100_{1-N}$. The FIFO registers 126, 128 and/or the buffers 130 may be used to balance different bandwidths (or speeds) between the encoder 122 and the NVSM 28 and/or between the decoder 124 and the NVSM 28.

The bandwidth of the ECC module 48 may be different than the bandwidth of the NVSM 28. The speeds of the encoder 122 and the decoder 124 may be faster than the speeds of each of the channels $100_{1-N}$. For example, the speeds of each of the encoder 122 and the decoder 124 may be 8-16 times faster than the speed of each of the channels $100_{1-N}$. Speed differences may also result due to, for example, data flow "bottlenecks" or delays in one or more of the channels $100_{1-N}$, which may be due to operations of the interface management module 50 and NVSM 28. The FIFO registers 126, 128 and the buffers 130 aid in balancing out the speed differences. The speed of the encoder 122 may be set to maintain operation of the channels $100_{1-N}$ at peak operating speeds. The speed of the decoder 124 may be set to prevent filling of the second set of FIFO registers 128 and maintain output of the channels $100_{1-N}$ at the peak operating speeds.

In the following FIGS. 3-6 and 8-13, multiple timing diagrams are shown. The timing diagrams include multiple instruction signals, which may be transmitted from the interface management module 50 to the NVSM 28 of FIG. 1. The instruction signals 102 include cycle type signals CT, timing strobe signals DQx, and status register bit signals SR[6]. The cycle type signals CT identify the type of instruction being provided in the timing strobe signals DQx. The timing strobe signals DQx may include, for example, command instructions CMD, NVSM address instructions ADDR, read instructions DOUT, program instructions DIN, which are identified by the cycle type signals CT. The timing strobe signals DQx identify the commands, the addresses, and the data being read or programmed. Examples of commands are a start of read command (e.g., 00h, 06h), an end of read command (e.g., 30h, 32h, E0h), a start of program command (e.g., 80h), and an end of program command (e.g., 10h). Examples of addresses are a column address (e.g., C1, C2) and a row address (e.g., R1, R2, R3).

The status register signals SR[6] indicate wait times between instruction sets of the cycle type signals CT and the timing strobe signals DQx. An instruction set may be an initiating (or triggering) instruction set, a read instruction set, or a program instruction set. The triggering instruction sets are used to signal the NVSM 28 that; a read operation or a program operation is to be performed; the amount of data and/or the number of allocation blocks being transferred; the addresses of the allocation blocks; etc. The read instruction sets refer to when data is transferred (or loaded) from the NVSM 28 to the interface management module 50 or the ECC module 48. The program instruction sets refer to when data is transferred from the interface management module 50 or the ECC module 48 to the NVSM 28.

The wait periods may include a trigger to prepare period tWB, a read preparing period tR, a ready to read period tRR, a trigger to load period tADL, a program preparing period tPROG, a plane busy period tPBSY, a change column setup period tCCS, etc. The NVSM 28 prepares for data transfer events during the read preparing period tR and the program preparing period tPROG. Each data transfer event has a single read preparing period or a single program preparing period.

Also, in the following FIGS. 3-6 and 8-13, multiple instruction sets are shown. The instruction sets are provided as part of the cycle type and timing strobe signals CT, DQx.

Each of the instruction sets includes groups of instructions separated by one or more of the above-described wait periods. The instructions are shown as hexagonally-shaped blocks. Each instruction set may include any number of instructions.

Also, in the following FIGS. 3-6 and 8-13, multiple descriptors are identified. Arrows of the descriptors do not necessarily refer to the timing of the descriptors. The arrows of the descriptors are provided to identify the instructions that are generated based on each one of the descriptors. For each one of the descriptors, one or more sets of instructions are generated. For example, in FIG. 5 multiple page descriptors$_{1-3}$ are shown with respective arrows and corresponding instructions. The page descriptors$_{1-3}$ may be generated by the NVSM control module 27 and transmitted to the command management module 60 prior to the instructions shown in FIG. 5 being generated.

The descriptors of FIGS. 3-6 and 8-13 may be page descriptors or allocation block descriptors. A page descriptor refers to a descriptor used to trigger and/or transfer one or more pages of data. An allocation block descriptor refers to a descriptor used to trigger and/or transfer one or more allocation blocks of data. The page descriptors and the allocation block descriptors may be trigger descriptors, read descriptors, or program descriptors. The trigger descriptors are used to initialize a data transfer event (read or program event). As an example, the trigger descriptors may identify a command type (read or program), target addresses within the NVSM 28 and/or buffer managing module 44, and how much data is to be transferred (e.g., number of pages and/or number of allocation blocks).

The read descriptors are used to read data from the NVSM 28. The program descriptors are used to program data to the NVSM 28. As an example, the read descriptors and the program descriptors may identify how much data is to be transferred and the locations of the data within a page of data. A descriptor may be both a trigger descriptor and a read descriptor. See, for example, the first descriptor (AU descriptor$_1$) of FIG. 8. A descriptor may alternatively be both a trigger descriptor and a program descriptor. See, for example, the first descriptor (AU descriptor$_1$) of FIG. 11.

Figure 3:
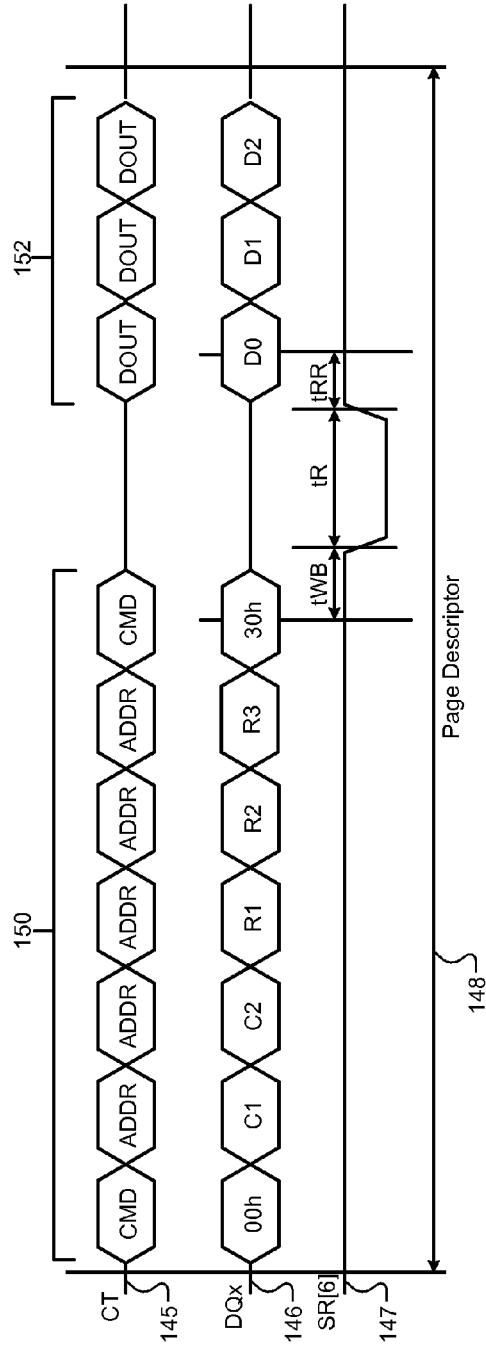
FIG. 3 is a timing diagram illustrating a single page read event for a page based transfer according to the present disclosure.

FIG. 3 shows a timing diagram illustrating a single page read event for a page based transfer. The timing diagram includes instruction signals CT (145), DQx (146) and SR[6] (147) that are generated based on a single page descriptor with arrow 148. The instruction signals 145-147 are examples of the instruction signals 102. As illustrated, each of the cycle type and timing strobe signals 145, 146 include two instruction sets 150, 152. The first instruction sets 150 are triggering instruction sets. The second instruction sets 152 are read instruction sets. Each of the instruction sets 150, 152 includes instructions (shown as hexagonally-shaped blocks).

The page descriptor may be generated by the NVSM control module 27. The command management module 60 generates the first and second parameter signals 80, 82 based on the page descriptor. The interface management module 50 generates the instruction signals 145, 146 and 147 based on the second parameter signal 82. The NVSM 28 prepares for a data transfer event based on the first instruction sets of the instruction signals during the read preparing period tR.

The NVSM 28 transfers a page of data via one of the channels 100 to the interface management module 50 based on the instruction signals 145, 146 and 147 subsequent to the read preparing period tR. The amount of data (or size of the block of data) transferred for this read event may be equal to the size of 1 page of data. As an alternative, the size of the block of data transferred may be less than 1 page of data. The amount of data transferred may be equal to a size of an allocation block of data. The size of the allocation block may be set as described above. An allocation block descriptor may be used as an alternative to the page descriptor 148 when allocation blocks of data are transferred. An allocation block descriptor refers to a descriptor that is used to trigger and/or transfer one or more allocation blocks of data.

Figure 4:
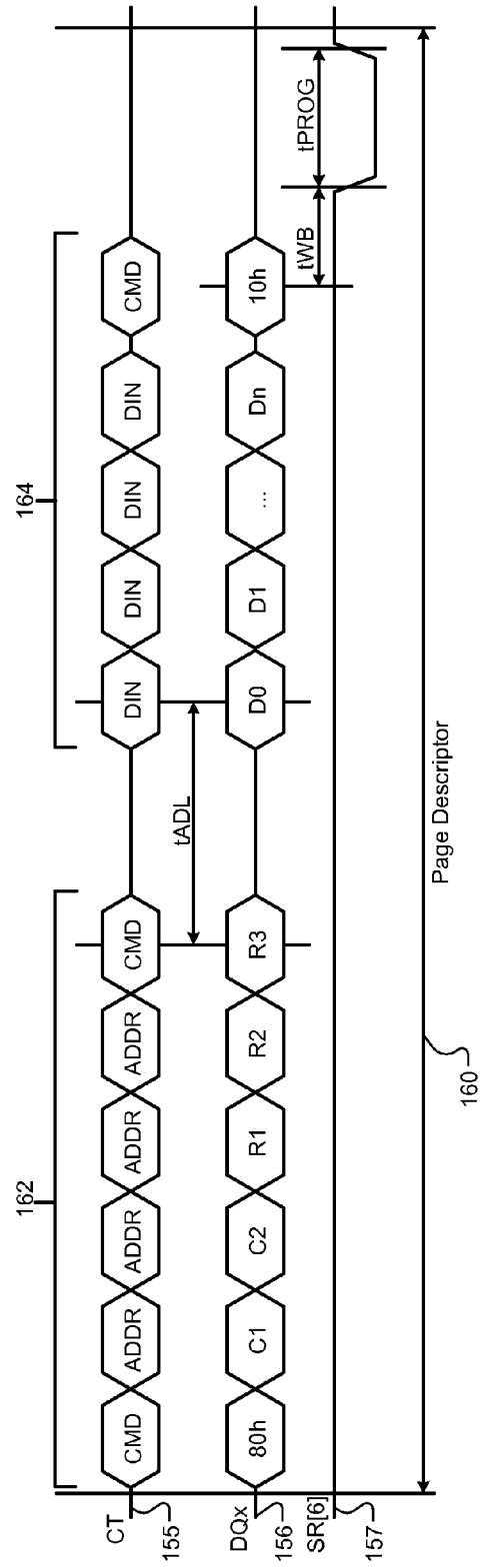
FIG. 4 is a timing diagram illustrating a single page program event for a page based transfer according to the present disclosure.

FIG. 4 shows a timing diagram illustrating a single page program event for a page based transfer. The timing diagram includes instruction signals CT (155), DQx (156) and SR[6] (157) that are generated based on a single page descriptor with arrow 160. The instruction signals 155-157 are examples of the instruction signals 102. As illustrated, the signals 155 and 156 each include two instruction sets 162, 164. The first instruction sets 162 are triggering instruction sets. The second instruction sets 164 are program instruction sets.

The page descriptor of FIG. 4 may be generated by the NVSM control module 27. The page descriptor is generated to both initiate (or trigger) the transfer of data and perform the transfer of the data. The command management module 60 generates the first and second parameter signals 80, 82 based on the page descriptor 160. The NVSM 28 generates the instruction signals 155-157 based on the second parameter signal 82. The NVSM 28 prepares for a data transfer event based on the first instruction sets 162 during a trigger-to-load period tADL.

The ECC module 48 transfers a page of data to the interface management module 50. The page of data may be stored in a FIFO register of the interface management module 50. The interface management module 50 transfers the page of data to the NVSM 28 via one of the channels 100. The data is transferred to the channel subsequent to the trigger-to-load period tADL and prior to a program preparing period tPROG.

The amount of data (or size of the block of data) transferred for this program event may be equal to the size of 1 page of data, as described or alternatively may be less than 1 page of data. The amount of data transferred may be equal to a size of an allocation block. The size of the allocation block of data may be set as described above. An allocation block descriptor may be used as an alternative to the page descriptor when allocation blocks of data are transferred.

Figure 5:
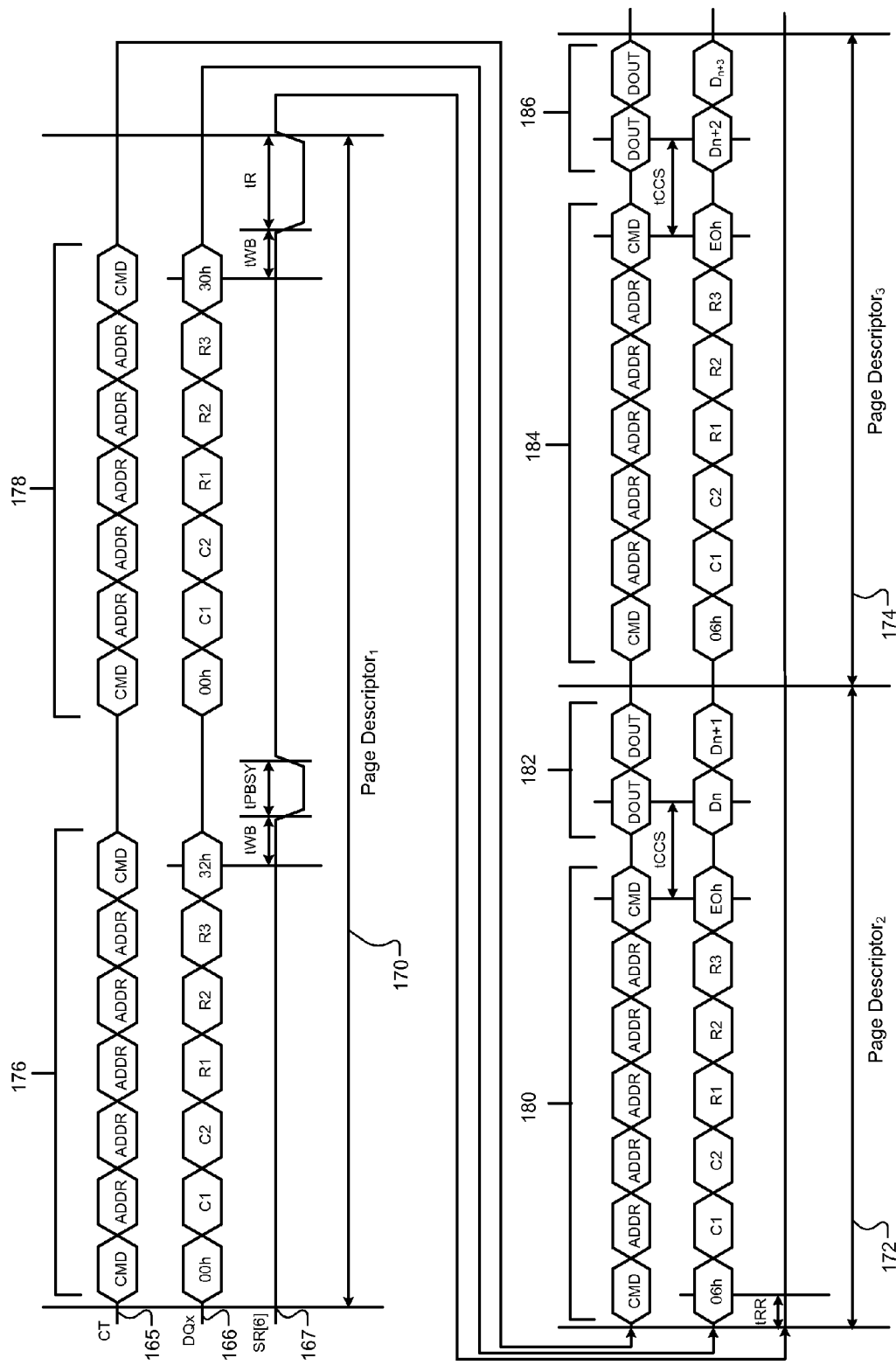
FIG. 5 is a timing diagram illustrating a multi-page read event using multiple descriptors according to the present disclosure.

FIG. 5 shows a timing diagram illustrating a multi-page (or multi-plane) read event using multiple page descriptors. The timing diagram includes instruction signals CT (165), DQx (166) and SR[6] (167) that are generated based on multiple page descriptors Page Descriptor$_{1-3}$ with arrows 170, 172, 174. As illustrated, each of the signals 165 and 166 include six instruction sets 176, 178, 180, 182, 184, 186. The instruction signals 165-167 are examples of the instruction signals 102. The first and second instruction sets 176, 178 are triggering instruction sets for the multi-page read event. The third and fifth instruction sets 180, 184 are triggering instructions for each page. The fourth and sixth instruction sets 182, 186 are read instruction sets.

The six instruction sets 176-186, as shown, are used to transfer 2 pages of data. Additional instructions sets may be added for additional pages. In this example, the number of triggering instructions sets T per signal is equal to twice the number of pages P transferred (or T=2*P). The number of read instruction sets R per signal is equal to the number of pages P transferred (or R=P). Also, the number of page descriptors D is equal to the number of pages plus one (or D=P+1).

The page descriptors Page Descriptor$_{1-3}$ may be generated by the NVSM control module 27. The command management module 60 generates the first and second parameter signals 80, 82 based on the page descriptors Page Descriptor$_{1-3}$. The NVSM 28 generates the instruction signals 165-167 based on the second parameter signal 82. The NVSM 28 prepares for a data transfer event for transferring the pages of data based on the first and second instruction sets 176, 178.

Figure 10:
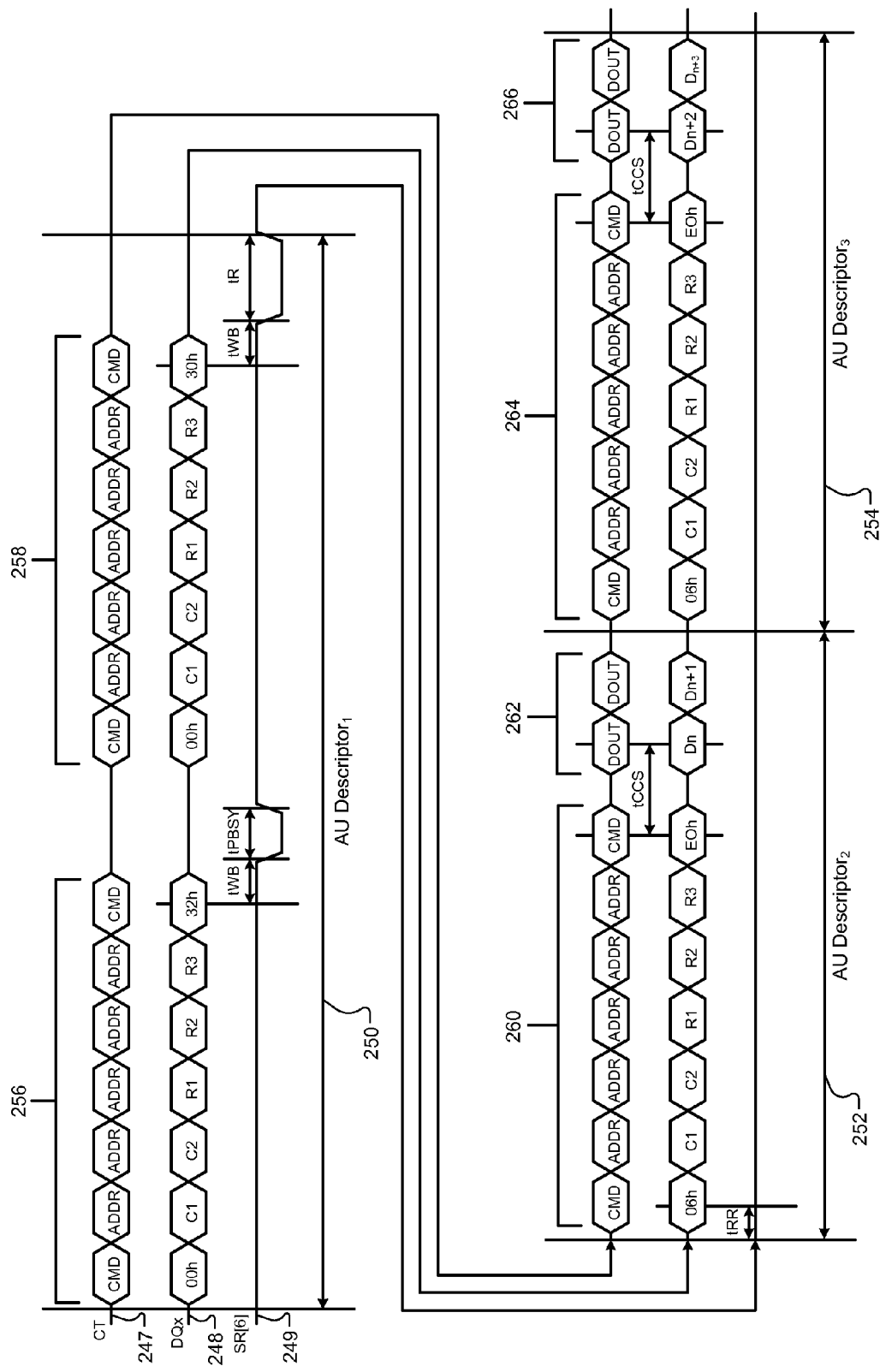
FIG. 10 is a timing diagram illustrating a multi-allocation block read event with multiple instruction sets according to the present disclosure.

The NVSM 28 then prepares for and transfers each of the pages of data via one or more of the channels 100 to the interface management module 50 based on the instruction signals (i.e. the instruction sets 180-186) subsequent to a read prepping period tR. The amount of data (or size of the block of data) transferred for each pair of read instruction sets 182, 186 (1 read instruction set for the CT signal and 1 read instruction set for the DQx signal) may be equal to the size of 1 page of data. As an alternative, the size of the block of data transferred may be less than 1 page of data. The amount of data transferred may be equal to a size of an allocation block of data. The size of the allocation block of data may be set as described above. Allocation block descriptors may be used as an alternative to page descriptors Page Descriptor$_{1-3}$ when allocation blocks of data are transferred. An example of this is shown in FIG. 10.

Figure 6:
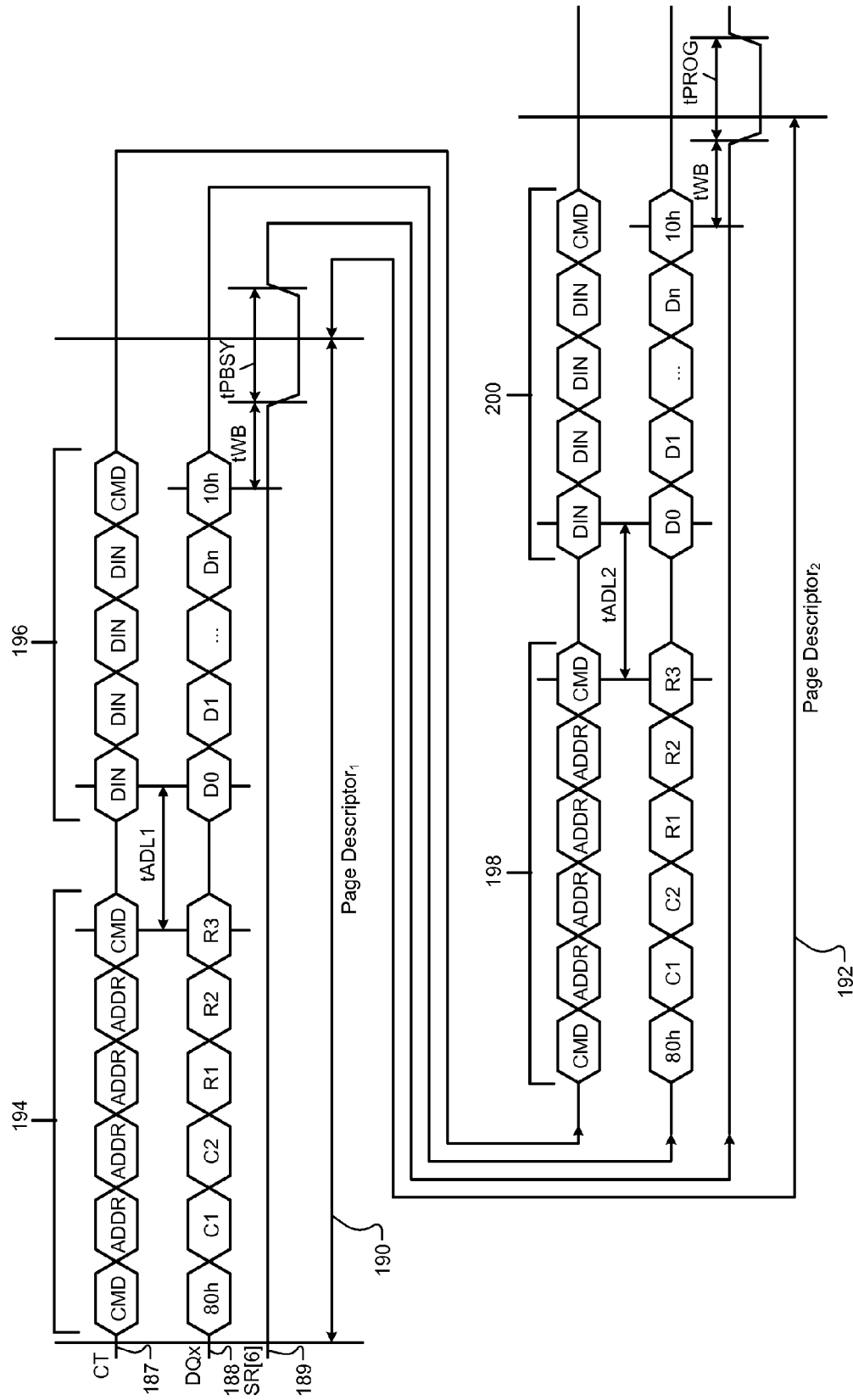
FIG. 6 is a timing diagram illustrating a multi-page program operation using multiple descriptors according to the present disclosure.

FIG. 6 shows a timing diagram illustrating a multi-page program event using multiple page descriptors. The timing diagram includes instruction signals CT (187), DQx (188) and SR[6] (189) that are generated based on multiple page descriptors Page Descriptor$_{1-2}$ with arrows 190, 192. The instruction signals 187-189 are examples of the instruction signals 102. As illustrated, the signals 187 and 188 each include four instruction sets 194, 196, 198, 200. The first and third instruction sets 194, 198 are triggering instruction sets for the multi-page read event. The second and fourth instruction sets 196, 200 are program instruction sets.

The four instruction sets 194-200, as shown, are used to transfer 2 pages of data. Additional instructions sets may be added for additional pages. In this example, the number of triggering instructions sets T per signal is equal to the number of pages P transferred (or T=P). The number of program instruction sets G per signal is equal to the number of pages P transferred (or G=P). Also, the number of page descriptors D is equal to the number of pages transferred (or D=P).

The page descriptors Page Descriptor$_{1-2}$ may be generated by the NVSM control module 27. The page descriptors Page Descriptor$_{1-2}$ may be generated by the NVSM control module 27. The command management module 60 generates first and second parameter signals 80, 82 based on the page descriptors Page Descriptor$_{1-2}$. The NVSM 28 generates the instruction signals 187-189 based on the second parameter signal 82. The NVSM 28 prepares for data transfer events based on the first and third instruction sets 194, 198 during respective trigger-to-load periods tADL1, tADL2.

The ECC module 48 transfers the pages of data to the interface management module 50. The pages of data may be stored in FIFO registers of the interface management module 50. The interface management module 50 transfers the pages of data to the NVSM 28 via one of the channels 100. The pages of data is transferred to the channel subsequent to the trigger-to-load periods tADL1, tADL2 and prior to a program preparing period tPROG.

Figure 13:
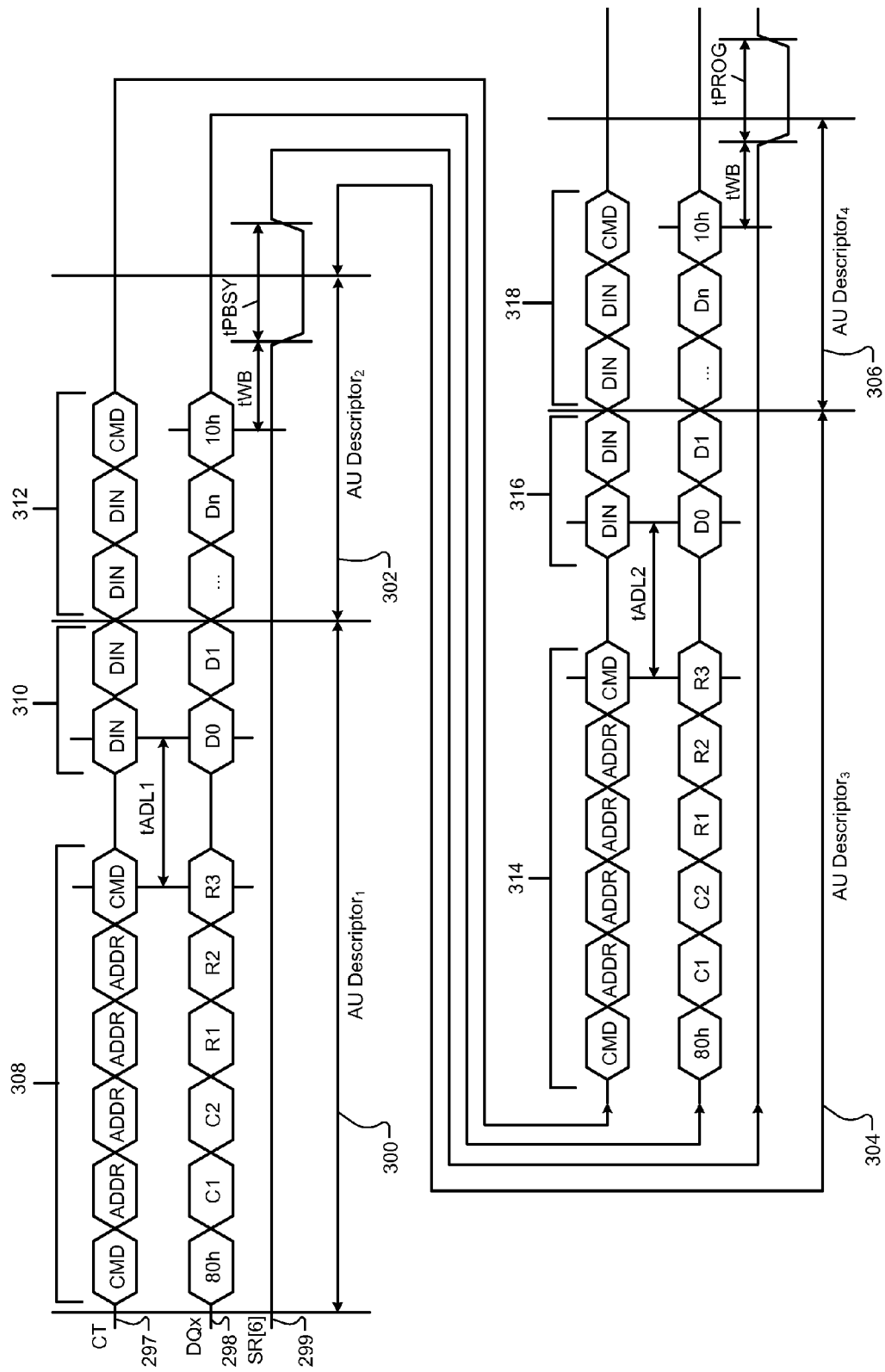
FIG. 13 is a timing diagram illustrating a multi-allocation block read event with multiple instruction sets according to the present disclosure.

The amount of data (or size of the blocks of data) transferred for each of the program instructions 196, 200 may be equal to the size of 1 page of data, as described or alternatively may be less than 1 page of data. The amount of data transferred may be equal to a size of an allocation block of data. The size of the allocation block may be set as described above. Allocation block descriptors may be used as an alternative to the page descriptors Page Descriptor$_{1-2}$ when allocation blocks of data are transferred. An example of this is shown in FIG. 13.

In the above FIGS. 5 and 6, as there is a single read preparing period tR and a signal program period tPROG, wait time is minimized for multi-page transfer events.

In FIG. 7, a portion 210 of an interface management control system is shown illustrating multi-page program events with page-sized transfers. The portion 210 may be incorporated into the interface management control system 26 of FIG. 1. Each transfer may fill one of the FIFO registers 126 of the interface management module 50. Each page of data transferred may have two associated page descriptors (not shown), as described above with respect to FIG. 6.

Each of the FIFO registers 126 is connected to a respective one of Channels$_{0-7}$ of the NVSM 28. Channels$_{0-7}$ may be included in the channels 100 of FIG. 1. Although the FIFO registers 126 may each be sized to store more than 1 page of data, the FIFO registers 126 are each shown as being able to store 1 page of data. If a multi-page (M-page) transfer is performed (as described above), the FIFO registers 126 do not need to be sized to store M pages of data, as one or more page descriptors are used per page of data transferred. Sizing the FIFO registers 126 to store a single page of data rather than two or more pages of data reduces memory allocated for the FIFO registers 126 and decreases data transfer times. If only a single descriptor was used to transfer the M pages of data, each of the FIFO registers 126 would need to be sized to equal the amount of data in a page of data, because each descriptor is associated with a single channel and/or a single FIFO register.

In a multi-page transfer event, data that is provided to the interface management module 50 is spread across multiple channels page-by-page. Pages of data Data$_{1-16}$ are shown. A single page is transferred to each of the Channels$_{0-7}$ prior to sending a second page to any of the Channels$_{0-7}$. The pages of data are transferred from the FIFO registers 126 to the Channels$_{0-7}$ based on speeds of the Channels$_{0-7}$ and/or devices internal to the NVSM 28. As the pages of data are transferred to each of the FIFO registers 126, probability of a data bottleneck at any one of the FIFO registers 126 is reduced. For example, if transfer speed of a first channel (e.g., Channel$_0$) is slow, a bottleneck at a corresponding first FIFO register FIFO$_1$ may not occur, as pages of data are loaded into the other FIFO registers FIFO$_{2-8}$ prior to loading another page of data into the first FIFO register FIFO$_1$.

Figure 8:
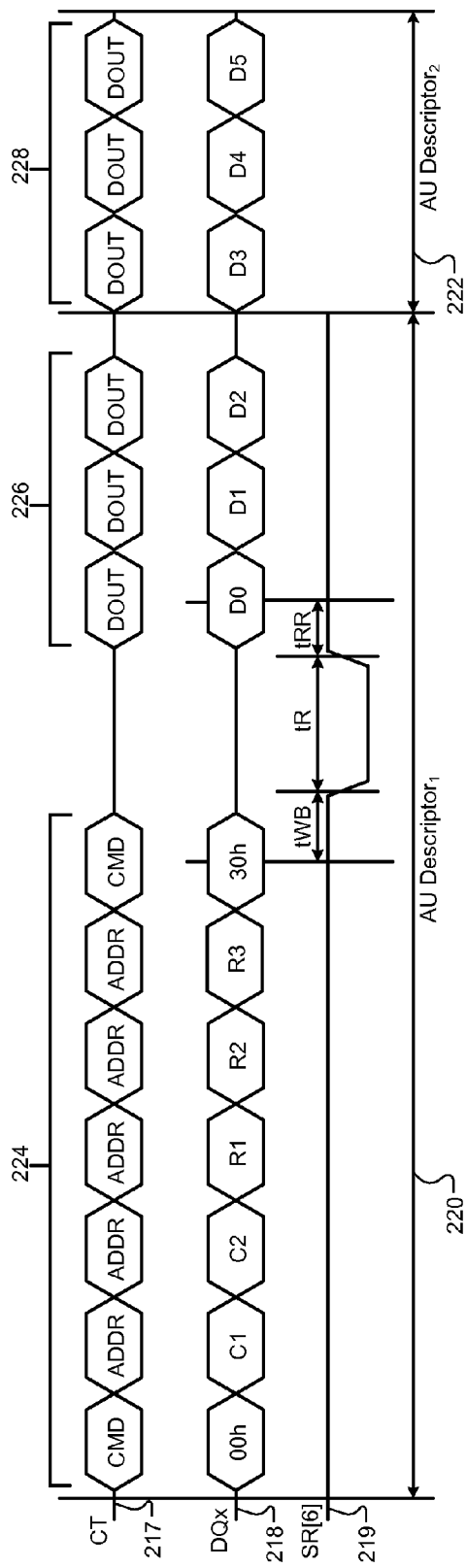
FIG. 8 is a timing diagram illustrating a read event with the same number of descriptors as allocation blocks transferred according to the present disclosure.

FIG. 8 shows a timing diagram illustrating a read event with the same number of descriptors as allocation blocks transferred. The timing diagram includes instruction signals CT (217), DQx (218) and SR[6] (219) that are generated based on multiple allocation block descriptors AU Descriptor$_{1-2}$ with arrows 220, 222. The instruction signals 217-219 are examples of the instruction signals 102. As illustrated, the signals 217 and 218 each include three instruction sets 224, 226, 228. The first instruction sets 224 are triggering instruction sets. The second instruction sets 226 are first read instruction sets. The third instruction sets 228 are second read instruction sets.

Each of the read instruction sets 226, 228 is associated with an allocation block of data. The first descriptor AU Descriptor$_1$ is associated with the first and second instruction sets 226, 228. A second descriptor AU Descriptor$_2$ is associated with the third instruction sets 228.

The allocation block descriptors AU Descriptor$_{1-2}$ may be generated by the NVSM control module 27. The command management module 60 generates the first and second parameter signals 80, 82 based on the allocation block descriptors AU Descriptor$_{1-2}$. The interface management module 50 generates the instruction signals 217-219 based on the second parameter signal 82. The NVSM 28 prepares for a data transfer event based on the first instruction sets 224 during a read preparing period tR.

The NVSM 28 transfers the allocation blocks of data via one of the channels 100 to the interface management module 50 based on the instruction signals 217-219 subsequent to the read preparing period tR. The allocation blocks of data may be spread block-by-block to different, adjacent and/or sequential FIFO registers of the interface management module 50. The amount of data (or size of the allocation blocks of data) transferred for this read event may be, for example, less than or equal to the size of 1 page of data. The size of the allocation blocks of data may be set as described above.

Figure 9:
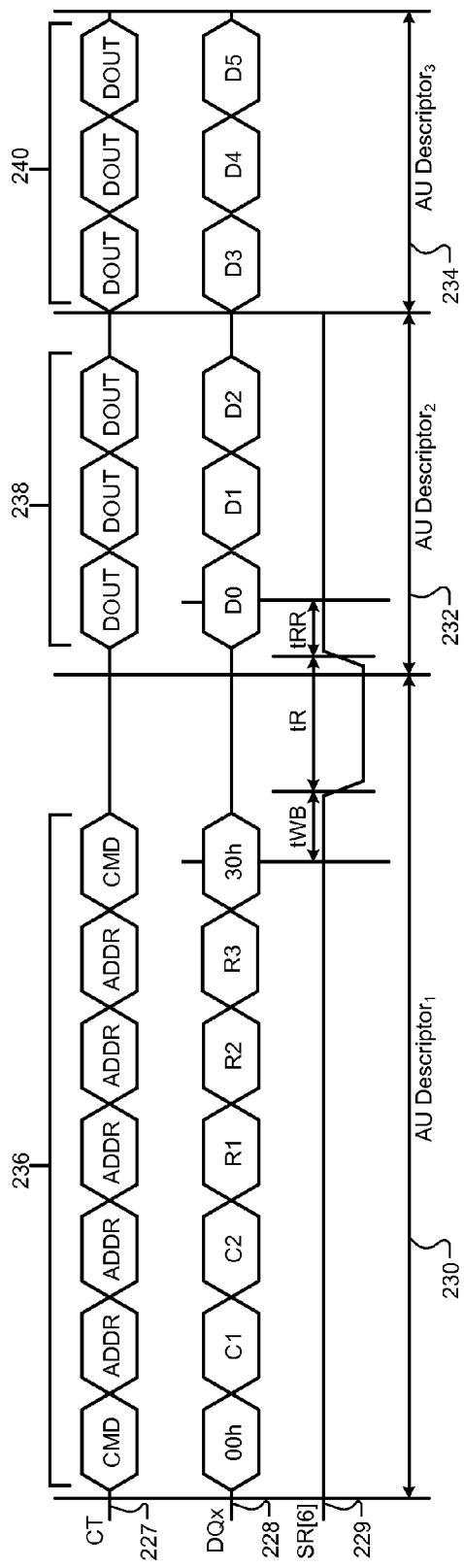
FIG. 9 is a timing diagram illustrating a read event with more descriptors than allocation blocks transferred according to the present disclosure.

FIG. 9 shows a timing diagram illustrating a read event with more descriptors than allocation blocks transferred. The timing diagram includes instruction signals CT (227), DQx (228) and SR[6] (229) that are generated based on multiple allocation block descriptors AU Descriptors$_{1-3}$ with arrows 230, 232, 234. The instruction signals 227-229 are examples of the instruction signals 102. The number of allocation block descriptors AUD is equal to the number of allocation blocks AB transferred plus one (or AUD=AB+1). As illustrated, each of the signals 227 and 228 includes three instruction sets 236, 238, 240. The first instruction sets 236 are triggering instruction sets. The second instruction sets 238 are first read instruction sets. The third instruction sets 240 are second read instruction sets.

Each pair of read instruction sets 238, 240 (1 read instruction set in the CT signal and 1 read instruction set in the DQx signal) is associated with an allocation block of data. The first descriptor AU Descriptors$_2$ is associated with the first instruction sets 236. The second descriptor AU Descriptors$_2$ is associated with the second instruction sets 238. The third descriptor AU Descriptors$_3$ is associated with the third instruction sets 240.

The allocation block descriptors AU Descriptors$_{1-3}$ may be generated by the NVSM control module 27. The command management module 60 generates the first and second parameter signals 80, 82 based on the allocation block descriptors AU Descriptors$_{1-3}$. The interface management module 50 generates the instruction signals 227-229 based on the second parameter signal 82. The NVSM 28 prepares for a data transfer event based on the first instruction sets 236 during a read preparing period tR.

The NVSM 28 transfers the allocation blocks of data via one of the channels 100 to the interface management module 50 based on the instruction signals 227-229 subsequent to the read preparing period tR. The amount of data (or size of the allocation blocks of data) transferred for this read event may be, for example, less than or equal to the size of 1 page of data. The size of the allocation blocks of data may be set as described above.

The implementation of FIG. 8 uses fewer descriptors than the implementation of FIG. 9. The use of fewer descriptors may decrease the number of signals generated and transferred between the modules of the interface management control system 26. The use of fewer descriptors may also reduce mapping table size and operations of the NVSM control module 27. The use of more descriptors by the implementation of FIG. 8 can increase firmware design flexibility by providing increased data transfer control of instruction sets and management of smaller sized allocation blocks.

FIG. 10 shows a timing diagram illustrating a multi-allocation block read event with multiple instruction sets. The implementation of FIG. 10 is similar to the implementation of FIG. 5, except allocation block descriptors are generated to transfer allocation blocks of data instead of page descriptors being generated to transfer pages of data. The timing diagram includes instruction signals CT (247), DQx (248) and SR[6] (249) that are generated based on multiple allocation block descriptors AU Descriptors$_{1-3}$ with arrows 250, 252, 254. The instruction signals 247-249 are examples of the instruction signals 102.

As illustrated, the signals 247 and 248 each include six instruction sets 256, 258, 260, 262, 264, 266. The first and second instruction sets 256, 258 are triggering instruction sets for the multi-page read event. The third and fifth instruction sets 260, 264 are triggering instructions for each page. The fourth and sixth instruction sets 262, 266 are read instruction sets. The six instruction sets 256-266, as shown, are used to transfer 2 pages of data. Additional instructions sets may be added for additional pages. In this example, the number of triggering instructions sets T per signal is equal to twice the number of pages P transferred (or T=2*P). The number of read instruction sets R per signal is equal to the number of pages P transferred (or R=P). Also, the number of page descriptors D is equal to the number of pages minus one (or D=P−1).

The allocation block descriptors AU Descriptors$_{1-3}$ may be generated by the NVSM control module 27. The command management module 60 generates first and second parameter signals 80, 82 based on the allocation block descriptors AU Descriptors$_{1-3}$. The NVSM 28 generates the instruction signals 247-249 based on the second parameter signal 82. The NVSM 28 prepares for a data transfer event for transferring the allocation blocks of data based on the first and second instruction sets 256, 258.

The NVSM 28 then prepares for and transfers each of the allocation blocks of data via one or more of the channels to the interface management module 50 based on the instruction signals 247-249 (i.e. the instructions sets 260, 264) subsequent to a read preparing period tR. The amount of data (or allocation block size) transferred for each pair of read instruction sets 262, 266 (1 read instruction set for the CT signal and 1 read instruction set for the DQx signal) may be less than or equal to the size of 1 page of data.

FIG. 11 shows a timing diagram illustrating a program event with the same number of descriptors as allocation blocks transferred. The timing diagram includes instruction signals CT (267), DQx (268) and SR[6] (269) that are generated based on multiple allocation block descriptors AU Descriptors$_{1-2}$ with arrows 270, 272. The instruction signals 267-269 are examples of the instruction signals 102. As illustrated, the signals 267 and 268 each include three instruction sets 274, 276, 278. The first instruction sets 274 are triggering instruction sets. The second instruction sets 276 are first program instruction sets. The third instruction sets 278 are second program instruction sets.

The allocation block descriptors AU Descriptors$_{1-2}$ may be generated by the NVSM control module 27. The command management module 60 generates first and second parameter signals 80, 82 based on the allocation block descriptors AU Descriptors$_{1-2}$. The NVSM 28 generates the instruction signals 267-269 based on the second parameter signal 82. The NVSM 28 prepares for a data transfer event based on the first instruction sets 274 during a trigger-to-load period tADL.

The ECC module 48 transfers the allocation blocks of data to the interface management module 50. The allocation blocks of data may be stored in a FIFO register of the interface management module 50. The interface management module 50 transfers the allocation blocks of data to the NVSM 28 via one of the channels 100. The data is transferred to the channel subsequent to the trigger-to-load period tADL and prior to a program preparing period tPROG. The amount of data (the combined size of the allocation blocks of data) transferred for this program event may be less than or equal to the size of 1 page of data.

FIG. 12 shows a timing diagram illustrating a program event with more descriptors than allocation blocks transferred. The timing diagram includes instruction signals CT (277), DQx (278) and SR[6] (279) that are generated based on multiple allocation block descriptors AU Descriptors$_{1-3}$ with arrows 280, 282, 284. The instruction signals 277-279 are examples of the instruction signals 102. The number of allocation block descriptors AUD is equal to the number of allocation blocks AB transferred plus one (or AUD=AB+1). As illustrated, the 277 and 278 signals each include three instruction sets 286, 288, 290. The first instruction sets 286 are triggering instruction sets. The second instruction sets 288 are first program instruction sets. The third instruction sets 290 are second program instruction sets.

The allocation block descriptors AU Descriptors$_{1-3}$ may be generated by the NVSM control module 27. The command management module 60 generates the first and second parameter signals 80, 82 based on the allocation block descriptors AU Descriptors$_{1-2}$. The NVSM 28 generates the instruction signals 277-279 based on the second parameter signal 82. The NVSM 28 prepares for a data transfer event based on the first instruction sets 286 during a trigger-to-load period tADL.

The ECC module 48 transfers the allocation blocks of data to the interface management module 50. The allocation blocks of data may be stored in a FIFO register of the interface management module 50. The interface management module 50 transfers the allocation blocks of data to the NVSM 28 via one of the channels 100. The data is transferred to the channel subsequent to the trigger-to-load period tADL and prior to a program preparing period tPROG. The amount of data (the combined size of the allocation blocks of data) transferred for this program event may be less than or equal to the size of 1 page of data.

FIG. 13 shows a timing diagram illustrating a multi-allocation block read event with multiple instruction sets. The implementation of FIG. 13 is similar to the implementation of FIG. 6, except allocation block descriptors are generated to transfer allocation blocks of data instead of page descriptors being generated to transfer pages of data. In addition, two page descriptors are generated per allocation block of data transferred instead of a single page descriptor being generated per page of data transferred.

The timing diagram of FIG. 13 includes instruction signals CT (297), DQx (298) and SR[6] (299) that are generated based on multiple allocation block descriptors AU Descriptors$_{1-4}$ with arrows 300, 302, 304, 306. The instruction signals 297-299 are examples of the instruction signals 102. As illustrated, the signals 297 and 298 each include six instruction sets 308, 310, 312, 314, 316, 318. The first and fourth instruction sets 308, 314 are triggering instruction sets for the multi-allocation block read event. The second and fifth instruction sets 310, 316 are program instruction sets for first and third allocation blocks of data. The third and sixth instruction sets 312, 318 are program instruction sets for transferring second and fourth allocation blocks of data. Additional trigger and program instructions sets may be added for additional allocation blocks of data.

In this example, the number of triggering instructions sets T per signal is equal to twice the number of allocation blocks of data AB transferred (or T=2*AB). The number of program instruction sets G per signal is equal to the number of allocation blocks of data transferred (or G=AB). The number of allocation blocks per trigger instruction set may be increased by the NVSM control module 27.

The allocation block descriptors AU Descriptors$_{1-4}$ may be generated by the NVSM control module 27. The command management module 60 generates the first and second parameter signals 80, 82 based on the allocation block descriptors AU Descriptors$_{1-4}$. The NVSM 28 generates the instruction signals 297-299 based on the second parameter signal 82. The NVSM 28 prepares for a data transfer event based on the first instruction sets 308, 314 during trigger-to-load periods tADL1, tADL2.

The ECC module 48 transfers the allocation blocks of data to the interface management module 50. The first and second allocation blocks of data may be stored in a first FIFO register of the interface management module 50. The third and fourth allocation blocks of data may be stored in a second FIFO register of the interface management module 50. The interface management module 50 may transfer the allocation blocks of data to the NVSM 28 via two of the channels 100. The allocation blocks of data are transferred to the channels subsequent to the trigger-to-load periods tADL1, tADL2 and prior to a program preparing period tPROG. As an alternative, the first, second, third, and fourth blocks of data may be transferred to one of the first and second FIFO registers and transferred to the NVSM 28 via one of the channels 100.

The amount of data (or size of the allocation blocks of data) transferred for each pair of the program instruction sets (the first and second program instruction sets 310, 312 or the third and fourth program instruction sets 316, 318) may be less than or equal to the size of 1 page of data. In the example shown, if 1 page of data is transferred for each pair of trigger instruction sets (1 trigger instruction set for the CT signal and 1 trigger instruction set for the DQx signal), then the size of two allocation blocks is equal to the size of a page of data. The number of allocation blocks per transfer of a page of data may be increased by reducing the allocation block size.

In FIG. 14, a portion 330 of an interface management control system is shown illustrating an allocation block based program events with allocation block sized transfers. This portion 330 may be incorporated into the interface management control system 26 of FIG. 1. Each allocation block of data transferred may fill one of FIFO registers 126' of the interface management module 50. Each allocation block of data transferred may have, for example, two or three associated allocation block descriptors (not shown), as described above with respect to FIGS. 11 and 12.

Each of the FIFO registers 126' is connected to one of Channels$_{0-7}$ of the NVSM 28. Although the FIFO registers 126' may each be sized to store more than 1 allocation block of data, the FIFO registers 126' are each shown as being able to store 1 allocation block of data.

The size of each of the FIFO registers 126' may be based on the size of the allocation blocks of data and may be independent of a size of a page of data. Any number of allocation blocks may be equal to the size of one page of data. Reducing the sizes of the allocation blocks of data and the FIFO registers 126' can further increase data transfer speeds, increase parallel data transfer efficiency, and prevent data bottlenecks.

In a multi-allocation block transfer event, data that is provided to the interface management module 50 is spread across multiple channels block-by-block. Allocation blocks of data Data$_{1-32}$ are shown. A single allocation block of data is transferred to each of the channels prior to sending a second allocation block to any of the channels. The allocation blocks of data are transferred from the FIFO registers 126' to the channels based on speeds of the channels and/or devices internal to the NVSM 28. As the allocation blocks of data are transferred to each of the FIFO registers 126', probability of a data bottleneck at any one of the FIFO registers 126 is reduced.

FIG. 15 shows a portion 340 of an interface management control system. The portion 340 may be incorporated into the interface management control system 26 of FIG. 1, replace the portion 120 of FIG. 2, and includes an ECC module 48', an interface management module 50' and the NVSM 28. Unlike the implementation of FIG. 2, the ECC module 48' includes multiple encoders 342 and multiple decoders 344 and the interface management module 50' does not include FIFO registers. Each of the encoders 342 may transfer data at approximately the same speed as the channels 100 of the NVSM 28.

During a program event, the DDS generating module 46 may spread allocation blocks of data to the encoders 342 similar to the spreading of allocation blocks of data to FIFO registers as described with respect to the implementations of, for example, FIGS. 2 and 8-14. The implementation of FIG. 15 further decreases the amount of memory used to transfer data to and from the NVSM 28 by not incorporating FIFO registers in the interface management module 50'. As FIFO registers are not incorporated, this implementation can support any page size or allocation block size. This increases development flexibility of the firmware 92. This implementation may also increase parallel data transfer efficiency.

Use of FIFO registers with sizes less than the size of a page and/or the elimination of FIFO registers, as described in FIGS. 14 and 15, minimizes hardware/memory requirements.

Figure 16:
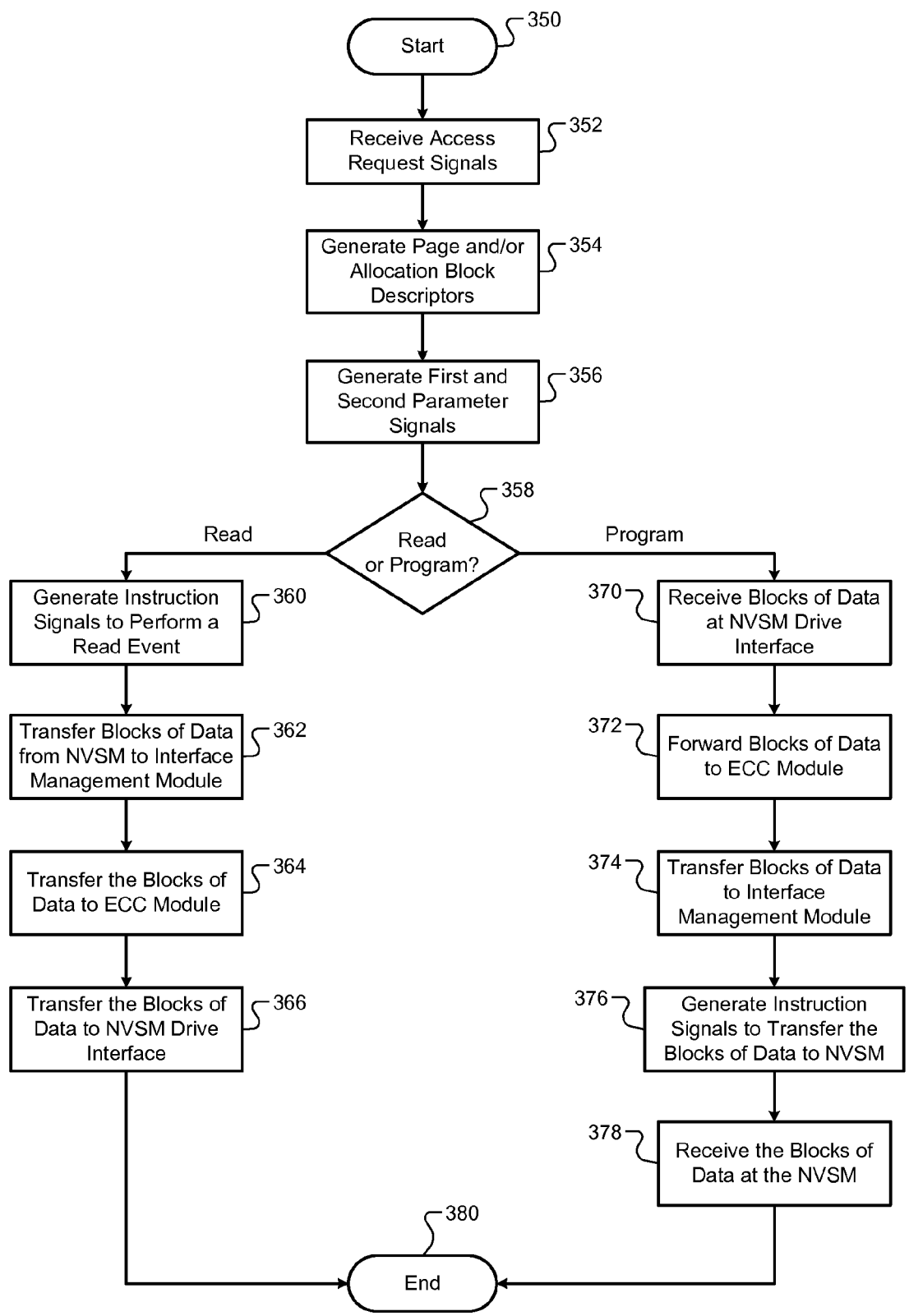
FIG. 16 illustrates a method of operating a NVSM storage system and a NVSM drive according to the present disclosure.

The NVSM storage system 10 and/or the NVSM drive 14 may be operated using numerous methods, an example allocation block based method is provided by the method of FIG. 16. In FIG. 16, a method of operating a NVSM storage system and a NVSM drive is shown. Although the following tasks are primarily described with respect to the implementations of FIGS. 1-15, the tasks may be easily modified to apply to other implementations of the present disclosure. The tasks may be iteratively performed. The method may begin at 350.

At 352, the NVSM drive interface 20 receives access request signals from the host interface 18 requesting that read, program, and/or erase events be performed.

At 354, the NVSM control module 27 generates page and/or allocation block descriptors based on the access request signals. The page and/or allocation block descriptors may be generated to perform one or more data transfer events. Each of the data transfer events may be a read event or a program event and include only one read preparing period or one program preparing period. The number of descriptors generated per data transfer event, page of data transferred, and/or allocation block of data transferred may be determined by the NVSM control module 27.

Each of the data transfer events includes two or more descriptors. The number of pages of data and/or the number of allocation blocks of data per transfer event may also be determined by the NVSM control module 27 and indicated in the generated descriptors. One or more pages of data and/or one or more allocation blocks of data may be transferred per data transfer event. Page sizes may be predetermined and fixed or may be set by the NVSM control module 27.

At 356, the command management module 60 generates the first parameter signal 80 and the second parameter signal 82 as described above based on the page and/or allocation block descriptors generated at 354.

At 358, an ECC module (e.g., one of the ECC modules 48, 48') and an interface management module (e.g., one of the interface management modules 50, 50') determine whether a read event or a program event is to be performed based on the first parameter signal 80 and the second parameters signal 82. Task 360 is performed when a read event is performed. Task 370 is performed when a program event is performed.

At 360, the interface management module generates the instruction signals 102 to instruct the NVSM 28 to transfer blocks of data from the NVSM 28 to the interface management module via the channels 100. The instruction signals 102 are generated based on the second parameter signal 82.

At 362, the NVSM 28 prepares for and transfers the pages of data and/or the allocation blocks of data to one or more of the channels 100 based on instruction sets of the instruction signals. The instruction sets may be as shown in, for example, FIGS. 3, 5, 8, 9 and/or 10. The pages of data and/or the allocation blocks of data may be received by FIFO registers of the interface management module.

At 364, the pages of data and/or the allocation blocks of data are transferred from the interface management module to the ECC module based on the parameter signals 80, 82. The pages of data and/or the allocation blocks of data may be transferred to one or more decoders of the ECC module, as shown in FIGS. 2, 7, 14 and 15.

At 366, the pages of data and/or the allocation blocks of data are transferred to the NVSM drive interface 20 via, for example, the HDS generating module 52, the buffer managing module 44, the decryption module 54 and the decompression module 56. The host 12 may receive the pages of data and/or the allocation blocks of data from the NVSM drive interface 20. Subsequent to performing task 366, the method may return to task 352 or end at 380, as shown.

At 370, the pages of data and/or the allocation blocks of data are received by the NVSM drive interface 20. At 371, the pages of data and/or the allocation blocks of data are forwarded to the ECC module via, for example, the compression module 40, the encryption module 42, the buffer managing module 44 and the DDS generating module 46.

At 372, the ECC module may transfer the pages of data and/or the allocation blocks of data to the interface management module based on the first parameter signal 80. The pages of data and/or the allocation blocks of data may be transferred from an encoder of the ECC module and spread to one or more FIFO registers of the interface management module, as shown in FIG. 2, 7 or 14. As an alternative, the pages of data and/or the allocation blocks of data may be transferred from multiple encoders of the ECC module to the interface management module, as shown in FIG. 15.

At 374, the interface management module generates instruction signals 102 to transfer the pages of data and/or the allocation blocks of data to the NVSM 28 based on the second parameter signal 82. The instruction signals 102 may include instruction sets. The instruction sets may be as shown in, for example, FIGS. 4, 6, 11, 12 and/or 13.

At 376, the NVSM 28 receives the pages of data and/or the allocation blocks of data via the channels 100. Subsequent to performing task 376, the method may return to task 352 or end at 380, as shown.

The above-described tasks of FIG. 16 are meant to be illustrative examples; the tasks may be performed sequentially, synchronously, simultaneously, continuously, during overlapping time periods or in a different order depending upon the application. For example, task 374 may be performed while task 376 is performed.

Some of the examples described above use multiple descriptors (as defined above) per page and/or multiple descriptors per allocation block transferred to and/or from NVSM. By generating and using multiple descriptors, firmware flexibility is increased over using only a single descriptor per transfer. Other examples are provided below that include generating one descriptor per allocation block. Performing data transfers based on a selected allocation block size allows read and program events to be performed independent of page sizes and allows a NVSM drive to accommodate any page size of a NVSM. Allocation blocks that are smaller than the size of a page are easier for firmware of a NVSM control module to handle, easier to encode and decode, and are easier for a host to handle. Reading allocation blocks from a NVSM as opposed to reading pages of data reduces read latency.

Also, allocation block based transfers allow for FIFO sizes of an interface management module of a NVSM drive to be independent of page sizes. Also, by spreading allocation blocks of data over multiple channels of a NVSM per transfer event improves transfer efficiency. The data may be spread to multiple channels without waiting for an additional block of data to be loaded into a FIFO of a channel, which has already received a block of data. This further decreases transfer latencies.

Figure 17:
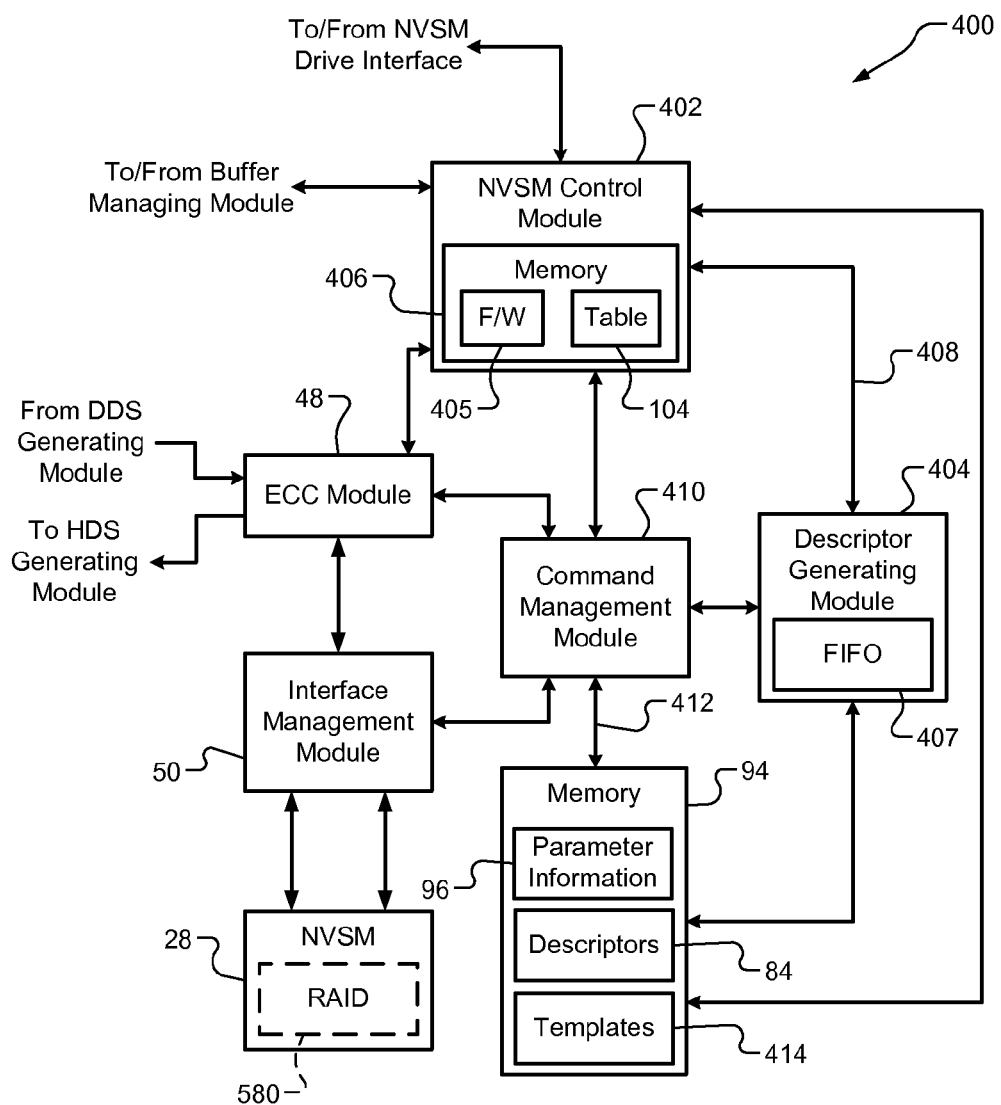
FIG. 17 is a function block diagram of a portion of a NVSM storage system incorporating a descriptor generating module according to the present disclosure.

FIG. 17 shows a portion 400 of a NVSM storage system that includes a NVSM control module 402 and a descriptor generating module 404. The NVSM control module 402 may operate similar to the NVSM control module 27 of FIG. 1, but is modified for operation with the descriptor generating module 404, as described below. The NVSM control module 402 may operate according to firmware 405 stored in memory 406 of the NVSM control module 402. The NVSM storage system 10 of FIG. 1 may be modified to include the portion 400.

To reduce firmware overhead for generating descriptors via firmware, the descriptor generating module 404 is included. The descriptor generating module 404 may include, for example, an electronic circuit and/or other suitable hardware for generating descriptors as described herein. Although the following examples refer to the descriptor generating module 404 as including hardware, the descriptor generating module 404 may include logic devices and/or a processor, which may execute firmware for descriptor generation. Firmware executed by the descriptor generating module 404 may be separate from and different than the firmware 405 executed by the NVSM control module 402.

The descriptor generating module 404 may be triggered to generate descriptors (e.g., hardware descriptors) by, for example the NVSM control module 402. The NVSM control module 402 may generate firmware (or first) descriptors and forward the firmware descriptors to a first-in-first-out (FIFO) memory 407 in the descriptor generating module 404. The firmware descriptors may include input parameters based on which the descriptor generating module 404 generates second descriptors (e.g., hardware descriptors). The second descriptors may be stored in the memory 94, similar to the other descriptors described above. The memory 94 may include FIFO memory allocated to storing descriptors (firmware and/or hardware descriptors). Descriptors generated using firmware, such as those generated by the NVSM control module 402, are referred to as firmware descriptors. Descriptors generated using hardware, such as those generated by the descriptor generating module 404, are referred to as hardware descriptors.

The descriptor generating module 404 may then report to the NVSM control module 402, via an advanced microcontroller bus (AHB) 408, that the second descriptors are generated and stored in the memory 94. This may be accomplished via, for example, a completion status flag generated by the descriptor generating module 404 and/or accessed by the NVSM control module 402. As another example, the completion of generating the second descriptors may be indicated via an interrupt generated by the descriptor generating module 404 and sent to the NVSM control module 402. Generation of the second descriptors by the descriptor generating module 404 reduces the amount of processing time of the NVSM control module 402 associated with the generation of descriptors. This allows the NVSM control module 402 to perform other tasks.

The portion 400 of the NVSM storage system includes the NVSM control module 402, the descriptor generating module 404, the ECC module 48, a command management module 410, the interface management module 50, and the NVSM 28. The NVSM control module 402 may be implemented as a system-on-chip (SoC) and include the memory 406. The memory 406 may store the firmware 405 and the table 104. The firmware 405 may be similar to the firmware 92 in FIG. 1, but is modified to implement firmware-to-hardware and/or single-to-multiple descriptor operations disclosed below. The firmware 405 generates firmware descriptors, which are each converted to one or more other descriptors (e.g., hardware descriptors) by the descriptor generating module 404. The table 104 may be stored in and/or shared with the descriptor generating module 404.

The command management module 410 operates similar to the command management module 60 of FIG. 1, but is modified to communicate with the descriptor generating module 404. The command management module 410 may receive and execute descriptors (e.g., hardware descriptors) received from the descriptor generating module 404. The command management module 410 is in communication with the memory 94 via, for example, an advanced extensible interface (AXI) bus 412. The command management module 410 may be referred to as a sequencer as the command management module 410 may sequentially execute a sequence of descriptors generated by the descriptor generating module 404. The memory 94 may store the parameter information 96, the descriptors 84, and templates 414. The descriptors 84 may include firmware and/or hardware descriptors. The firmware descriptors may be received from the NVSM control module 402 and/or from the descriptor generating module 404. The hardware descriptors may be received from the descriptor generating module 404.

Figure 18:
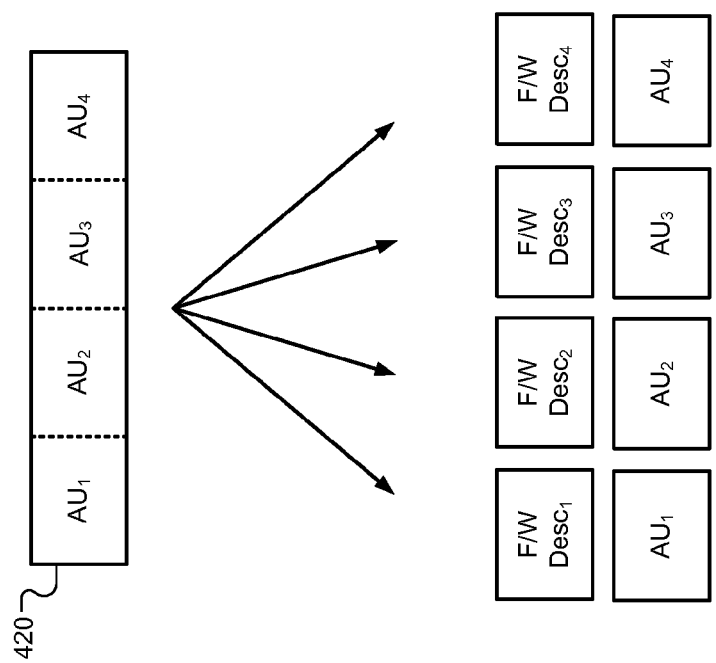
FIG. 18 is block diagram illustrating generation of a firmware descriptor per allocation unit according to the present disclosure.

FIG. 18 illustrates generation of a firmware descriptor per allocation unit and is described with respect to an embodiment of FIG. 1. The NVSM control module 27 may generate a firmware descriptor per allocation unit, which may then be stored in the memory 94. As an example four allocation units (or blocks) of data $AU_{1-4}$ are shown. The NVSM control module 402 generates firmware descriptors F/W $Desc_{1-4}$ for the $AU_{1-4}$ to control operation of the NVSM 28. The firmware descriptors F/W $Desc_{1-4}$ correspond respectively to the allocation units of data $AU_{1-4}$. The allocation units of data $AU_{1-4}$ are shown collectively as a single block of data 420 prior to the generation of the firmware descriptors. The allocation units of data $AU_{1-4}$ are shown separately subsequent to the generation of the firmware descriptors. The allocation units of data $AU_{1-4}$ may be separated to allow for parallel transfer of the allocation units of data $AU_{1-4}$ during the same period of time.

Figure 19:
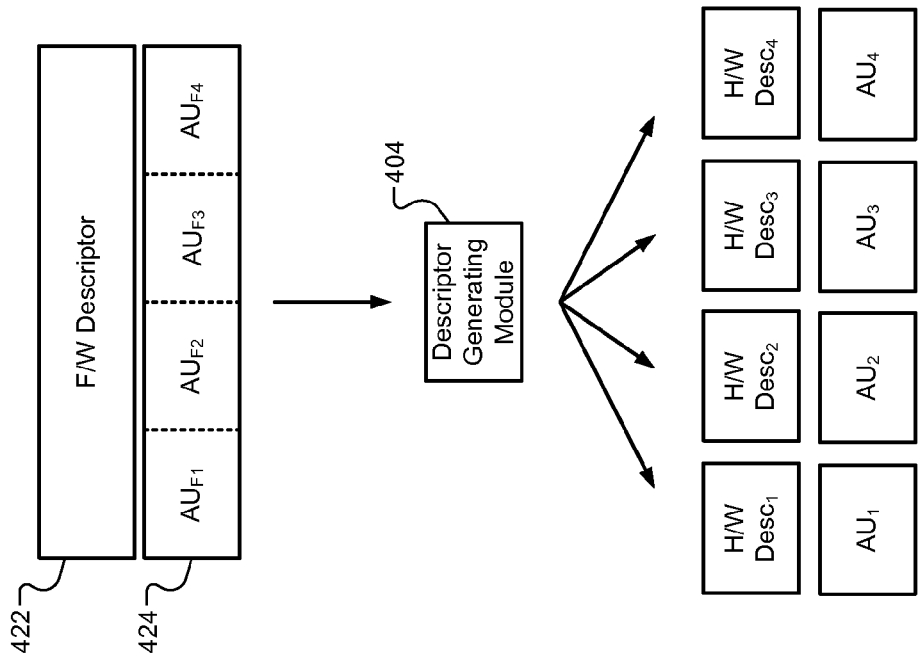
FIG. 19 is a block diagram illustrating generation of a hardware descriptor per allocation unit according to the present disclosure.

FIG. 19 illustrates generation of a descriptor (e.g., hardware descriptor) per allocation unit, as described with respect to the embodiments of FIG. 17. The NVSM control module 402 may generate a firmware (or first) descriptor 422 for a single block of data 424 having a predetermined number of allocation units of data $AU_{1-4}$. The firmware descriptor 422 may be stored in the memory 94 and/or provided to the descriptor generating module 404. The descriptor generating module 404 may generate a second descriptor for each of the allocation units of data $AU_{1-4}$. The second descriptors may be hardware descriptors and are identified as H/W Desc$_{1-4}$. The second descriptors are used to control the NVSM 28. The amount of data associated with the second descriptors is the same as the amount of data associated with the firmware descriptor 422 generated by the NVSM control module 402. Although a one-to-one relationship is shown between the second descriptors and the allocation units of data AU$_{1-4}$ in FIG. 19, each of the second descriptors may be associated with one or more allocation units of data AU$_{1-4}$. Conversions from firmware (or first) descriptors to the hardware (or second) descriptors is further described below.

Each of the allocation units of data AU$_{1-4}$ may have any amount of data. The size of the allocation units of data AU$_{1-4}$ may be predetermined, fixed and/or set by the NVSM control module 402. The size of the allocation units may be less than, equal to, or greater than the size of a page of data. Each of the second descriptors may be used to control the transfer of one or more pages of data and thus may correspond to a single or multiplane read and/or program (or write) operation. The descriptor generating module 404 may generate the second descriptors to spread the allocation units of data AU$_{1-4}$ to multiple channels of the NVSM 28 to maximize parallel transfer of data between the interface management module 50 and the NVSM 28.

The above-described features of FIGS. 17 and 19 allow the NVSM control module 402 to generate a single firmware descriptor when performing a multiplane (multiple page) transfer of data. This is because the descriptor generating module 404 converts the single firmware descriptor into multiple descriptors, which are executed by the command management module 410. The generation of the descriptors by the descriptor generating module 404 allows the NVSM control module 402 to continue to dispatch data to and from the NVSM 28 in an order recognizable to the NVSM 28. The descriptor generating module 404 may perform address mapping instead of the NVSM control module 402. The descriptor generating module 404 may map, for example logical block addresses for allocation units of data to physical block addresses. The physical block addresses are addresses of memory locations in the NVSM 28. The dispatching of data, the generating of descriptors, and the address mapping performed by the descriptor generating module 404 minimize the amount of calculations performed by the NVSM control module 402 in performing data transfers.

The memory 94 may include first-in-first-out (FIFO) registers as shown, for example, in FIG. 2. Each of the FIFO registers may be the same size as an allocation unit. As a result, the sizes of the FIFO registers may be independent of a page size of data. The matching of the sizes of the FIFO registers with the sizes of the allocation units of data, prevents speed mismatching between, for example, the ECC module 48 of FIG. 2 and the FIFO registers. By transferring amounts of data that are smaller than a page of data, less data is transferred in an out of the FIFO registers per transfer event, which allows for quicker data transfers. This reduces data transfer latencies associated with the FIFO registers. To further reduce transfer latencies, the ECC module 48 may rotate through the FIFO registers and/or corresponding channels when receiving data from and transferring data to the NVSM 28. A block of data may be split up into two or more portions of data during a transfer. For example, a 16 kilobytes (KB) block of data may be divided into two 8 KB portions. The first portion may be transferred to and/or from a first FIFO register while the second portion is transferred to and/or from a second FIFO register.

Figure 20:
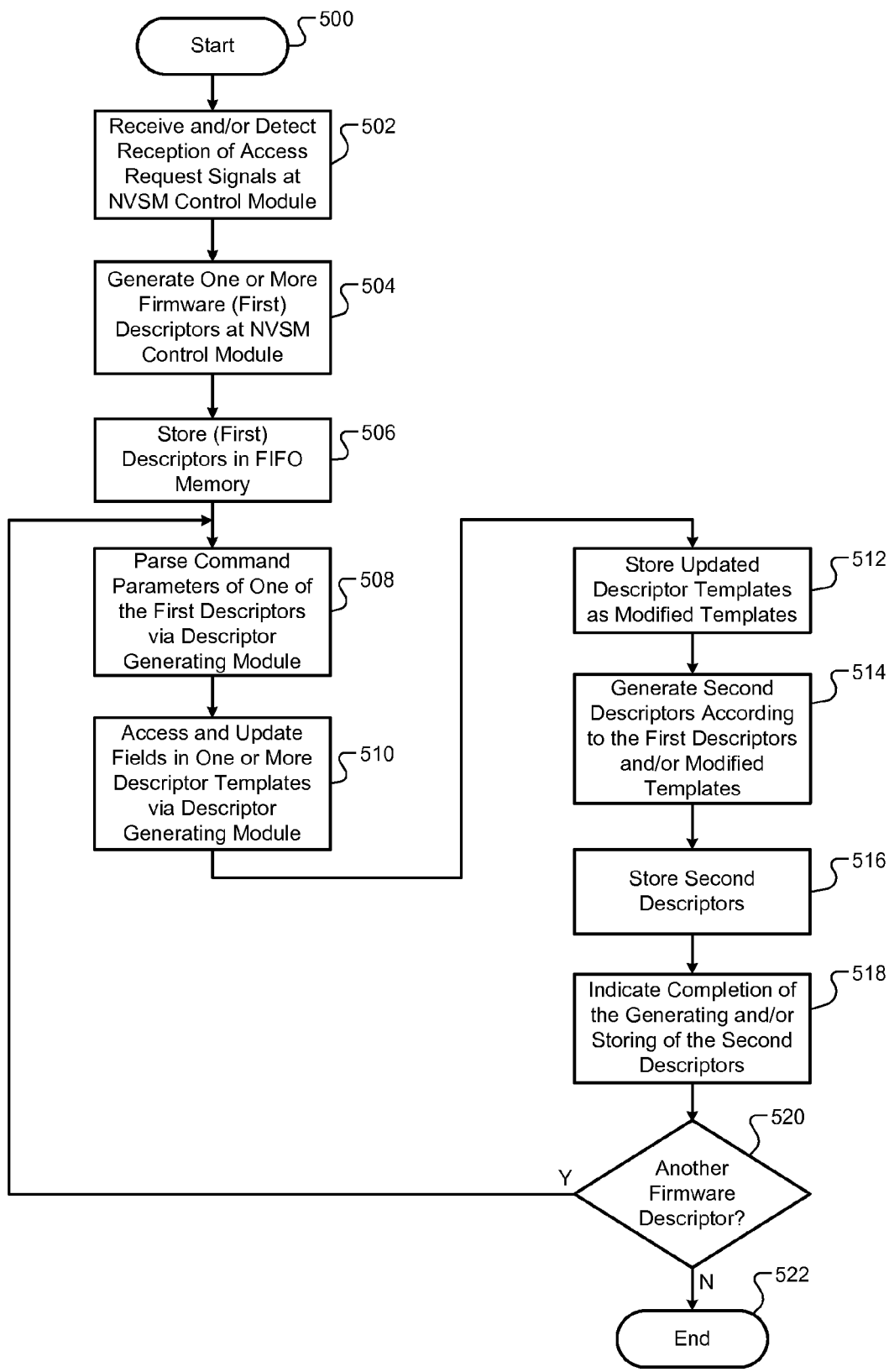
FIG. 20 illustrates a descriptor generating method according to the present disclosure.

As stated above, the NVSM storage systems disclosed herein may be operated using numerous methods. Another example method is illustrated in FIG. 20. FIG. 20 illustrates a descriptor generating method. Although the tasks of FIG. 20 are primarily described with respect to the examples of FIGS. 1, 17 and 19, the tasks may be applied to other embodiments of the present disclosure. The tasks of may be iteratively performed.

The method may begin at 500. At 502, the NVSM control module 402 receives and/or detects reception of access request signals from the host device 12. At 504, the NVSM control module 402, using the firmware 405, generates one or more firmware (first) descriptors based on the access request signals. FIG. 21 shows an example of a firmware descriptor 505 generated by the NVSM control module 402. The firmware descriptor 505 may include 3 control rows (identified as Rows 0-2) and 64 parameter rows (identified as Rows 3-66). Each of the control rows and parameter rows may have a word of information. Each of the words may be referred to as a descriptor word (or DWORD). Any number of control rows and parameter rows may be included in a firmware descriptor. In the parameter rows, each byte of information may be referred to as an input parameter. Each DWORD in the parameter rows may include 4 bytes of parameters. Since each firmware descriptor may include 64 parameter rows, each firmware descriptor may include 256 parameters.

The control rows of the firmware descriptor include control fields with control information. FIG. 22 shows an example of control rows for the firmware descriptor 505 of FIG. 21. The first control row Row 0 includes control fields PRMT_ROW_NUM, SRC_LEN and SRC_PTR. The second control row Row 2 includes control fields DF_SEL and DST_PTR. The third control row Row 3 includes control fields SC0-SC9. Reserved fields RSVD may be used for other control information. Descriptions for the control fields PRMT_ROW_NUM, SRC_LEN, SRC_PTR, DF_SEL and DST_PTR, and SC0-SC9 are provided in the below table.

| Table of Descriptor Fields | |
|---|---|
| Descriptor Field | Description |
| SRC_PTR | This field is a descriptor template pointer that indicates location of a template. May indicate physical address of template in the memory 94. The descriptor generating module 404 locates templates for descriptors based on the descriptor template pointer. |
| SRC_LEN | This field is indicates a descriptor template length and/or a number of, for example, descriptors (e.g., hardware descriptors) to generate. The descriptor generating module 404 uses the SCR-LEN filed to determine the number of descriptors to generate for the corresponding template and/or corresponding firmware descriptor. |

-continued

Table of Descriptor Fields

| Descriptor Field | Description |
| --- | --- |
| PRMT_ROW_NUM | This field indicates the number of parameter rows in the corresponding firmware descriptor. |
| DST_PTR | This field is a pointer indicating a location for storing the descriptors generated by the descriptor generating module 404 in the memory 94. May indicate one or more addresses in the memory 94. The descriptor generating module 404 stores the generated descriptors at the addresses indicated by the DST_PTR. |
| DF_SEL | This field is a priority selector field that indicates which type of FIFO memory or area of memory to put the descriptors generated by the descriptor generating module 404. The memory 94 may include two or more FIFO registers. As an example, the memory 94 may include high priority FIFO registers and low priority FIFO registers. The DF_SEL field may indicate whether to put the descriptors generated by the descriptor generating module 404 in a high priority FIFO register or a low priority FIFO register. The descriptors in high priority FIFO registers may be executed by the command management module 410 prior to the descriptors in the low priority FIFO registers. The descriptors in high priority FIFO registers may be executed quicker than the descriptors in the low priority FIFO registers. |
| SC0 | This control field indicates a channel and a device to send user data or other data associated with one or more descriptors generated by the descriptor generating module 404. Examples of channels are shown in FIG. 7 and 14. The device refers to a NVSM chip. For example, the NVSM 28 may include multiple NVSM and/or NAND chips. |
| SC1 | This control field is used for RAID control and may include a command RAID_CMD and an identifier RAID_ID. This control field may be used by the descriptor generating module 404 to generate read stripes. |
| SC2 | This control field is used for streaming control of data between a buffer managing module (e.g., the buffer managing module 44 of FIG. 1) and NVSM 28. This field may indicate whether to stream and/or transfer data from the buffer managing module to the NVSM 28 or to stream and/or transfer data from the NVSM 28 to the buffer managing module. This control field may alternatively indicate to stream and/or transfer data from the buffer managing module to the NVSM 28 while streaming and/or transferring data from the NVSM 28 to the buffer managing module. |
| SC3 | This control field indicates an address START_ROW_ADDR in the NVSM 28 where to start a data transfer. Data written to the NVSM 28 may begin at the address START_ROW_ADDR or data may be read from the NVSM 28 starting at the address START_ROW_ADDR. The address START_ROW_ADDR may include three parameters. The parameters include a page address, a block address, and a lun address. The page address is used as a row index to identify a specific row of memory cells. The block address is used as an array index to identify a specific array of memory cells. The lun address is used as a device, NVSM chip, and/or NAND chip index to identify a specific device, NVSM chip, and/or NAND chip. |
| SC4 | This control field indicates a column address START_COL_ADDR to start at when accessing the NVSM 28. |
| SC5 | This control field indicates how much data is being transferred for the one or more descriptors generated by the descriptor generating module 404. An amount of data per descriptor may be indicated. |
| SC6 | This control field may identify the segments of the buffer 70 in the buffer managing module 44 to be involved in a data transfer. Data may be transferred to or from a first segment of the buffer 70 while transferring data to or from another segment of the buffer 70. Data may be streamed to or from multiple segments of the buffer 70 during the same period of time. |
| SC7 | This control field may include pointers to physical addresses in the buffer of the buffer managing module. The buffer managing module 44 may jump (or skip) addresses when data is being transferred. When this occurs physical addresses may be effectively linked using the pointers. This field may be used by the descriptor generating module 404 to convert logical block addresses to physical block addresses while |

-continued

Table of Descriptor Fields

| Descriptor Field | Description |
| --- | --- |
| | accounting for the skipped addresses by using the provided pointers. |
| SC8 | This control field may be referred to as a command group identifier (ID) and used to identify a group of firmware descriptors stored in the memory 94. The descriptor generating module 404 may return this ID to the NVSM control module 402 subsequent to completing generation of descriptors by the descriptor generating module 404. |
| SC9 | This control field may be used to control parameters of the NVSM 28. For example, this field may include voltage reference adjustment values VREF used by NAND to distinguish between bit values stored in memory cells of the NAND. |

In addition to the information stated in the above table, each of the control fields of a firmware descriptor may also indicate whether to use either (i) default values and/or information in a template, or (ii) replace the default values and/or information in the template with corresponding values and/or information in the parameter rows of the firmware descriptor. For example, the control field SC0 may include a default bit, which may be set to '0' to indicate use of a corresponding default byte value in a template. The default bit may be set to '1' to indicate use of a corresponding byte value provided as one of the parameters in a parameter row of the firmware descriptor. The control fields may include more than one default bit. For example, the control field SC3 may include a default bit for each of a page address, a block address, and a lun address to indicate whether to use a default page address, a default block address, and/or a default lun address. These addresses are defined in the above table. In addition, each of the control fields may have different formats and the formats of the control fields may be set based on the application in which the corresponding NVSM system is being used.

At 506, the NVSM control module 402 sends the firmware descriptors to the FIFO memory 407. At 507, the NVSM control module 402 may trigger the descriptor generating module 404 subsequent to storing the firmware descriptors. The NVSM control module 402 may trigger the descriptor generating module 404 by, for example, sending a command signal to the descriptor generating module 404 indicating the transfer of the one or more firmware descriptors to the FIFO memory 407. Task 507 may not be performed. As another example, the descriptor generating module 404 may detect the transfer of the firmware descriptors and begin generation of hardware descriptors without receiving a command signal from the NVSM control module 402.

At 508, the descriptor generating module 404 accesses the FIFO memory 407 and parses command parameters from one or more of the firmware descriptors. At 510, the descriptor generating module 404 accesses one or more descriptor templates (referred to hereinafter as "templates") from the memory 94 and updates descriptor fields in the templates based on the command parameters in the one or more firmware descriptors. Each of the templates may be a generic descriptor and/or a flexible descriptor. A generic descriptor may have a predetermined set of parameter fields with predetermined default values in each of the parameter fields. A purpose of the generic descriptor may be fixed. A flexible descriptor refers to a descriptor for which parameter fields can be updated and/or used for different purposes. For example, fields of a flexible descriptor may be used to set different control parameters of a NVSM.

At 512, the descriptor generating module 404 stores the one or more templates as modified at 510 in the memory 94. The one or more templates as modified do not replace the corresponding one or more templates accessed at 510. This allows the same default templates and/or modified templates to be used for subsequently generated descriptors (hardware and/or firmware descriptors).

At 514, the descriptor generating module 404, for each of the firmware descriptors and according to the corresponding and modified template, generates one or more second descriptors (e.g., hardware descriptors). Multiple second descriptors may be generated for each of (i) the firmware descriptors generated by the NVSM control module 402, and/or (ii) corresponding and modified template. The second descriptors may include hardware and/or firmware descriptors. Examples of generating multiple hardware descriptors are described below with respect to the embodiments of FIGS. 24-26.

At 516, the descriptor generating module 404 stores the second descriptors generated at 514 in the memory 94. The second descriptors generated at 514 may be stored as part of or separate from a corresponding and modified template. At 518 and subsequent to generating and/or saving the second descriptors, the descriptor generating module 404 may indicate to the NVSM control module 402 that generation of the current one or more second descriptors is completed. The descriptor generating module 404 may provide this indication by: sending a status signal to the NVSM control module 402; setting a flag accessible to the NVSM control module 402 via, for example, the AHB bus 408; and/or by generating an interrupt. The status signal may be transmitted via the AHB bus 408.

At 520, the descriptor generating module 404 may determine whether there is another firmware descriptor generated by the NVSM control module 402 to convert to, for example, multiple hardware descriptors. If there is another firmware descriptor, task 508 may be performed, otherwise the method may end at 522.

During the above-described method, for example at 518, one or more status registers may be updated for each of the firmware descriptors generated, executed and/or converted to hardware descriptors. The descriptor generating module 404 may update the fields in the status registers during and/or subsequent to the descriptor generating module completing generation of one or more descriptors. The NVSM control module 402 may track these fields to determine whether firmware-to-hardware (or single-to-multiple) descriptor conversion has been executed and completed. FIG. 23 illustrates an example of a status register 530 that may be used for these tracking purposes.

The status register 530 shown includes four fields. The first field, identified as DGE_GENDES_CNT, indicates a number of descriptors (e.g., number of hardware and/or firmware descriptors) generated by the descriptor generating module 404 for a particular firmware descriptor. The second field, identified as DES_FIFO_ADDR, is an address pointer indicating an address in the memory 94 where the descriptors generated by the descriptor generating module 404 are stored. The third field, identified as DGE_ERR_CODE, indicates whether an error has occurred during the firmware-to-hardware and/or single-to-multiple descriptor conversion process. As an example, the third field may indicate when a parameter provided in a parameter row of a firmware descriptor is "out of boundary" meaning indiscernible by the descriptor generating module 404. The fourth field, identified as DES_FIFO_ADDR_WRAPPED, indicates whether a descriptor has wrapped a circular memory. For example, a buffer or FIFO register may be used as a circular memory such that upon filling the buffer or FIFO register remaining data is written over data at a beginning of the buffer or FIFO register. As a result, if a descriptor is larger than a buffer or FIFO register, a last portion of the descriptor may be written over a beginning portion of the descriptor in the buffer or FIFO register.

The above-described tasks of FIG. 20 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Figure 24:
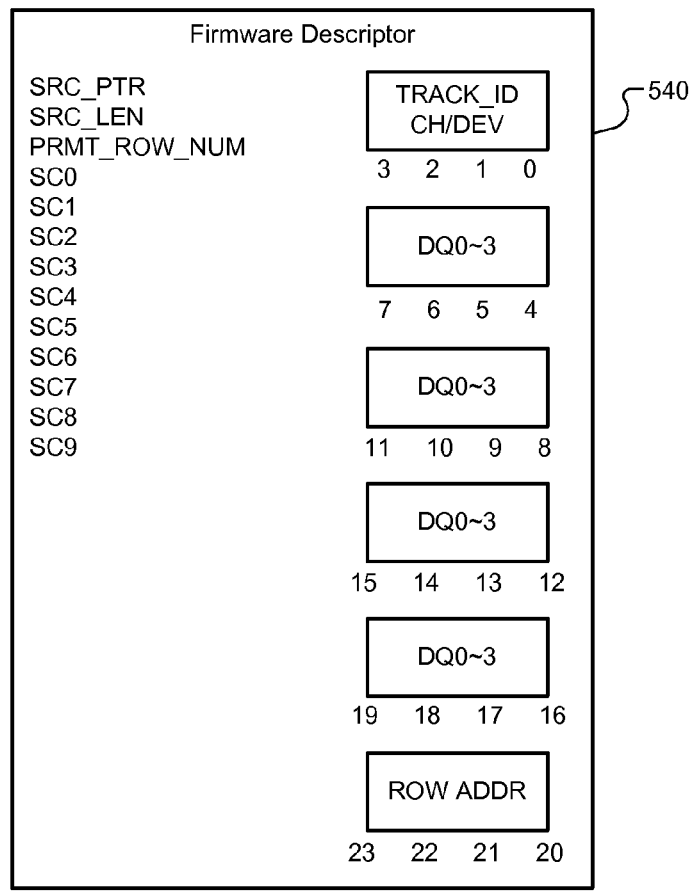
FIG. 24 illustrates an example of a firmware descriptor according to the present disclosure.
Figure 25:
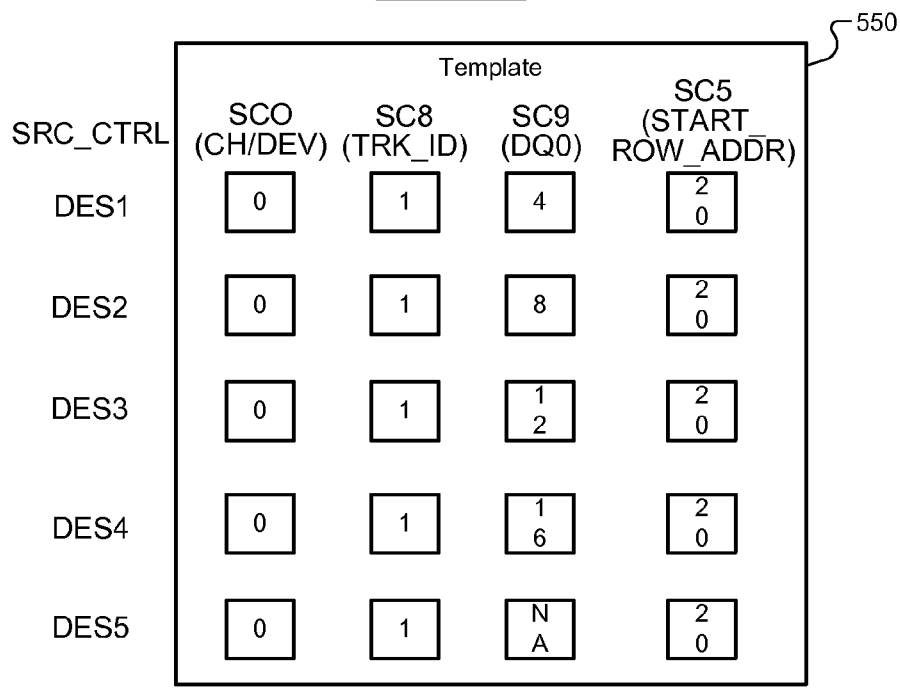
FIG. 25 illustrates an example of a template according to the present disclosure.

FIGS. 24 and 25 respectively illustrate an example of a firmware descriptor 540 and an example of a template 550. The firmware descriptor 540 may be generated by the NVSM control module 402 of FIG. 17. The firmware descriptor 540 and the template 550 may be stored in the memory 94 of FIG. 17. In the example shown, the firmware descriptor 540 is generated for a multi-level cell embodiment, where the cells of the NVSM 28 include triple-level cells (TLCs). Each of the TLCs may be able to store multiple bits of data.

In the example shown, the firmware descriptor 540 includes multiple fields, such as the fields SRC_PTR, SRC_LEN, PRMT_ROW_NUM. The firmware descriptor 540 may indicate which fields to include in the hardware (or second) descriptors generated by the descriptor generating module 404 of FIG. 17, such as the fields SC0, SC8, SC9, and SC5. The firmware descriptor 540 may include values for a channel and/or device identifier CH/DEV ID, a group command identifier TRACK_ID, a control parameter DQ0, and/or an address corresponding to the fields SC0, SC8, SC9, and SC5, as shown.

The firmware descriptor 540 may also include values to update corresponding descriptor values in the template 550. For example, bytes 0-3 of the firmware descriptor 540 correspond to the field SC8 of the template 550. As another example, the bytes 4-19 of the firmware descriptor 540 include values for fields DQ0-3 of the template 550. Values for the fields DQ0-3 may be provided for each of the first four descriptors in the template 550. The firmware descriptor 540 may also include bytes (e.g., bytes 20-23) having a start row address for field SC5.

As shown, the template 550 includes fields for each of 5 descriptors. The template 550 may include and number of fields for each descriptor and may have values for any number of descriptors. Also, any number of descriptors may be generated using the template 550 and/or values associated with a descriptor in the template 550. The number of descriptors generated based on the template 550 and/or a portion of the template 550 may be indicated via the fields SRC_PTR and SRC_LEN. The template 550 may be defined by a user, predetermined, and/or generated by the NVSM control module 402 and stored in the memory 94.

For a TLC read, up to four voltage reference (VREF) threshold adjustments for the NVSM 28 may be performed prior to issuing a read (or fifth) descriptor (e.g., DES5). For this reason, the template 550 may include descriptor values for the VREF adjustments. The descriptor values provided in the template 550 for the descriptors DES1-4 may be used respectively for the four VREF adjustments. The descriptor values DES1-4 may include a control parameter field SC9 with value DQ0, which may be used to indicate a respective VREF. In the example shown, control parameter fields DQ1-3 are not used. As an example, NVSM control module 402 may generate a firmware descriptor with a VREF adjustment values for respective upper, middle, and lower bits of memory cells. The VREF adjustment values may provide thresholds for determining states of the memory cells. In a two bit per memory cell example, the VREF adjustment values may provide thresholds for memory cell states 00, 01, 10, 11. The thresholds are used to distinguish between detected voltages corresponding to states of the memory cells to determine bit values of the memory cells.

The descriptors generated based on the template 550 may be generic and/or flexible descriptors. Each of the descriptors may include source control fields SRC_CTRL, such as the fields SC0, SC8, SC9, and SC5, as shown. The SC0 field may indicate, as described above, a channel CH and/or a device DEV. The SC8 field may indicate, as described above, a group command (or track) identifier. The SC5 field may indicate a start row address START_ROW_ADDR where data is stored in the NVSM 28. The values in the fields SC0, SC8, SC9, SC5 of the descriptor values DES1-5 are input parameter index values, which may be obtained from the firmware descriptor and may replace corresponding values in the template.

For example, if the field DQ0 is equal to 4 as indicated by the first descriptor value DES1, then the fields DQ0-3 for the first descriptor values DES1 are replaced by input parameter bytes 4-7.

The descriptor generating module 404 generates the five descriptors based on the descriptor values DES1-5 provided in the template 550 and input command parameters in the firmware descriptor 540, such as the input command parameters stored in bytes 4-19. In the example shown, the VREFs stored in bytes 4-19 are input command parameters. Other input command parameters (examples of which are disclosed above) may be provided via the firmware descriptor 540 and updated in the template 550.

The disclosed embodiments allow for templates and/or descriptors to be reused. As an example, to reuse the fourth descriptor values DES4, the NVSM control module 402 may set the field SCR_PTR to point to the fourth descriptor values DES4 and set the field SRC_LEN=2. This may be done to generate two descriptors using the same values in the same template 550.

Figure 26:
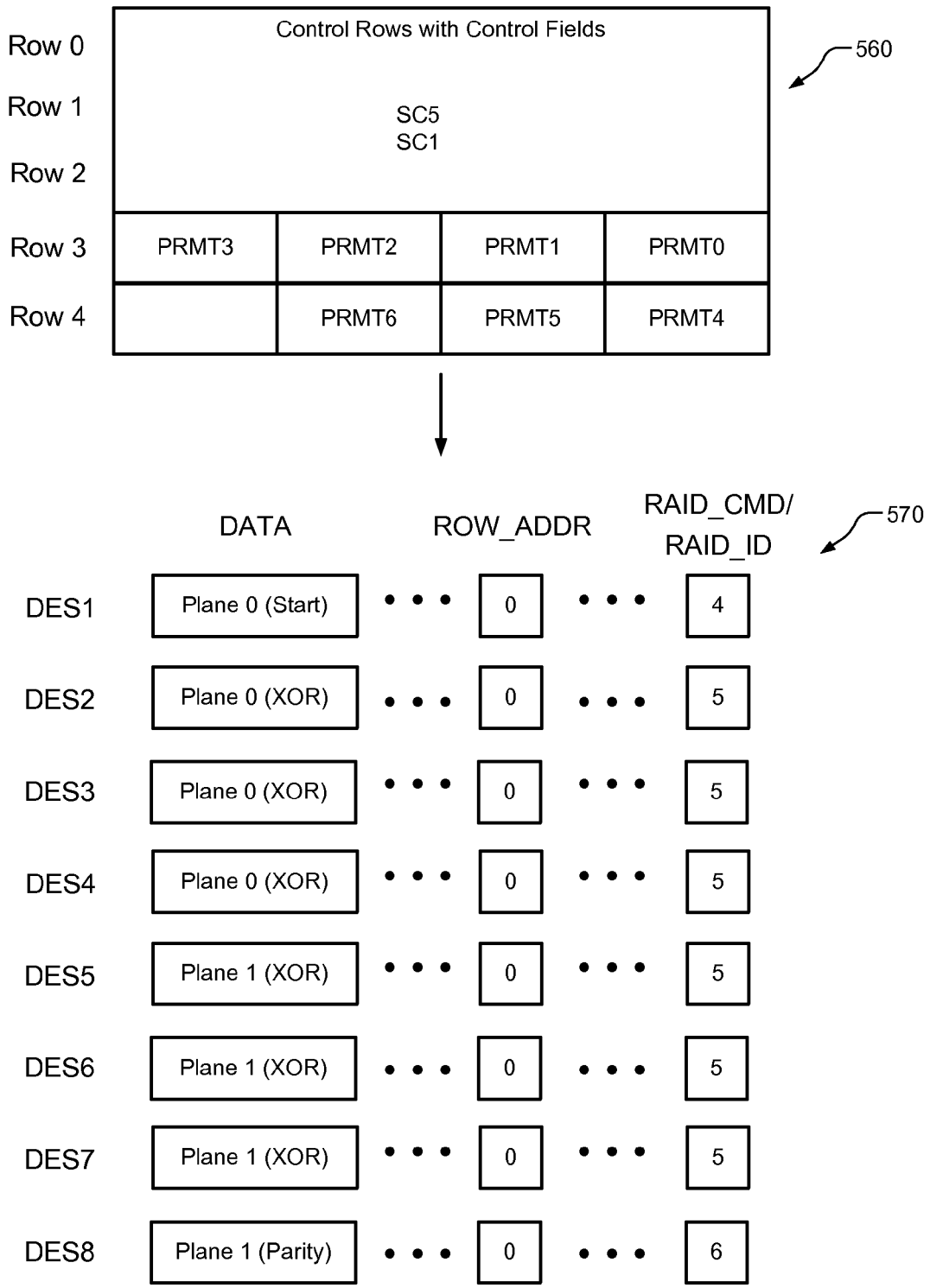
FIG. 26 illustrates generation of hardware descriptors for a redundant array of independent disks (RAID) according to the present disclosure.

FIG. 26 illustrates generation of hardware descriptors for a redundant array of independent disks (RAID). A RAID may include any number of memory chips (e.g., NAND chips), where each of the chips is referred to as a memory device (or disk). Multiple memory devices may share a single channel. For this reason, identification of the channel CH and the memory device DEV is provided when transferring data to and from the memory devices. The above-described field SC0 includes values for the channel and memory device.

FIG. 26 shows a firmware descriptor 560 as generated by the NVSM control module 402 of FIG. 17 and a template 570 with corresponding descriptor values DES1-8 generated based on the firmware descriptor 560. The firmware descriptor 560 may include control rows with control fields (identified as Rows 0-2) and input command parameter rows (identified as Rows 3-4). Although the control rows are shown as including the control fields SC5 and SC1, other control fields may be included. The descriptor generating module 404 may generate 8 descriptors based on the descriptor values DES1-8.

In the example shown, the template 570 is provided for generating multiple page descriptors during the same period of time. Each of the multiple page descriptors may be generated and/or executed while others of the multiple page descriptors are generated and/or executed. This is done to transfer a large amount of data (referred to as a "super block of data"). As an example 8 blocks of data may be transferred during the same period of time on respective channels and to respective memory devices in the NVSM 28. The NVSM 28 may include and/or be referred to as a RAID. In the example shown, the NVSM 28 includes a RAID 580. Each write operation may include writing 8 pages of data on respective channels to receptive memory devices in the NVSM 28. The SC0 field for each of the channels and memory devices may be included in the template 570, although not shown in FIG. 26.

The template 570, as shown, does include the START_ROW_ADDR, RAID_CMD/RAID_ID fields for each of the memory devices. These fields may be configured based on input parameter values provided in the firmware descriptor 560. For example, input parameter values PRMT0-3 may be used for the START_ROW_ADDR fields. The input parameter values PRMT4-6 may be used for the RAID_CMD/RAID_ID fields.

In operation, a large amount of data may be accumulated in, for example, the buffer 70 of FIG. 1. The NVSM control module 402 may then, via the firmware 405, access and/or generate the template 570 having the descriptor values DES1-8. The descriptor values DES1-8 may be generic descriptor values. The fields START_ROW_ADDR, RAID_CMD, RAID-ID of the template are filled with corresponding input parameter values from the firmware descriptor. The fields of the template 570 may include a DATA field. The DATA field may indicate whether the data for a corresponding descriptor is start data, exclusive-OR (XOR) data, or parity data. Start data refers to the first data associated with a descriptor. XOR data refers to data that is XOR'd together to provide parity data. The parity data may refer to redundant or error correction encoding (ECC) data used for data recovery. The descriptor generating module 404 of FIG. 17 may then generate 8 descriptors based on the template 570 for the parallel transfer of data on the corresponding 8 channels. This allows the NVSM control module 402 to trigger generation of many descriptors for the transfer of a large amount of data by generating a single firmware descriptor.

Because there are numerous implementations of the present disclosure, the arrangements do not explicitly show all of the implementations. For example, the adjacent and non-adjacent elements shown in, for example, FIGS. 1, 2, 7, 14, 15 and 17 may be directly or indirectly connected to each other. The adjacent and non-adjacent elements may wirelessly communicate with each other and/or may communicate with each other via wired links. The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

Although the terms first, second, third, etc. may be used herein to describe various elements, components, channels, modules, and/or devices, these elements, components, channels, modules, and/or devices should not be limited by these terms. These terms may be only used to distinguish one elements, components, channels, modules, and/or devices from another elements, components, channels, modules, and/or devices. Terms such as "first," "second," and other numerical terms when used herein do not imply a sequence or order unless clearly indicated by the context. Thus, a first elements, components, channels, modules, and/or devices discussed below could be termed a second elements, components, channels, modules, and/or devices without departing from the teachings of the example embodiments.

What is claimed is:

1. A storage drive comprising:
   a first module configured to control transfer of a plurality of blocks of data between a host device and the storage drive;
   a second module configured to transfer the plurality of blocks of data to and from a non-volatile semiconductor memory in the storage drive;
   a third module configured to generate a first descriptor, which describes a transfer of the plurality of blocks of data between the second module and the non-volatile semiconductor memory;
   a fourth module configured to, according to the first descriptor, generate a plurality of second descriptors, wherein each of the plurality of second descriptors corresponds to a respective one of the plurality of blocks of data;
   a fifth module configured to generate a parameter signal based on the plurality of second descriptors; and
   a sixth module configured to generate instruction signals based on the parameter signal,
   wherein the second module is configured to, based on the instruction signals, transfer the plurality of blocks of data between the first module and the non-volatile semiconductor memory.

2. The storage drive of claim 1, wherein the fourth module is configured to:
   access a template;
   update fields in the template based on a plurality of parameters in the first descriptor; and
   generate the plurality of second descriptors according to the template.

3. The storage drive of claim 2, wherein the fourth module is configured to replace values of the fields of the template with the plurality of parameters.

4. The storage drive of claim 2, wherein:
   the plurality of parameters include control parameters to control the non-volatile semiconductor memory; and
   the fourth module is configured to generate some of the plurality of second descriptors to include the control parameters and others of the plurality of second descriptors to not include the control parameters.

5. The storage drive of claim 2, wherein:
   the template includes redundant array of independent disk values for the plurality of second descriptors;
   the fourth module is configured to generate the plurality of second descriptors to respectively include the redundant array of independent disk values; and
   wherein the second module is configured to, based on the redundant array of independent disk values, transfer the plurality of blocks of data between the first module and the non-volatile semiconductor memory.

6. The storage drive of claim 2, wherein:
   the templates includes channel values and memory device values for each of the plurality of second descriptors; and
   the second module is configured to transfer portions of the data on respective channels to and from the non-volatile semiconductor memory according to the channel values and the memory device values.

7. The storage drive of claim 1, wherein the fourth module is configured to indicate to the third module when generation of the plurality of second descriptors is completed.

8. The storage drive of claim 7, wherein the fourth module is configured to generate an interrupt to indicate to the third module that the generation of the plurality of second descriptors is completed.

9. The storage drive of claim 7, wherein the third module is configured to poll the fourth module to determine whether the generation of the plurality of second descriptors is completed.

10. The storage drive of claim 7, wherein:
    the fourth module is configured to update fields of a status register, wherein the fields of the status register include a number of descriptors generated and an address of a location of the plurality of second descriptors; and
    the third module is configured to access the status register to determine whether the generation of the plurality of second descriptors is competed.

11. The storage drive of claim 1, further comprising a first-in-first-out register configured to store status information, wherein the status information includes a field indicating whether one of the plurality of second descriptors is larger than a size of the first-in-first-out memory.

12. The storage drive of claim 1, wherein:
    the first descriptor is a firmware descriptor; and
    the plurality of second descriptors are hardware descriptors.

13. The storage drive of claim 1, wherein:
    the third module is configured to execute firmware to generate the first descriptor; and
    the fourth module comprises an electronic circuit, wherein the electronic circuit is configured to generate the plurality of second descriptors according to the first descriptor.

14. A method comprising:
    controlling transfer of a plurality of blocks of data between a host device and a storage drive;
    generating a first descriptor to transfer the plurality of blocks of data to or from a non-volatile semiconductor memory in the storage drive;
    according to the first descriptor, generating a plurality of second descriptors, wherein each of the plurality of second descriptors corresponds to a respective one of the plurality of blocks of data;
    generating a parameter signal based on the plurality of second descriptors;
    generating instruction signals based on the parameter signal; and
    based on the instruction signals, transferring the plurality of blocks of data between the host device and the non-volatile semiconductor memory.

15. The method of claim 14, further comprising:
    accessing a template;
    updating fields in the template based on a plurality of parameters in the first descriptor; and
    generate the plurality of second descriptors according to the template.

16. The method of claim 15, further comprising:
    replacing values of the fields of the template with the plurality of parameters,
    wherein the plurality of parameters include control parameters to control the non-volatile semiconductor memory;

generating some of the plurality of second descriptors to include the control parameters; and generating others of the plurality of second descriptors to not include the control parameters.

17. The method of claim 14, further comprising indicating when generation of the plurality of second descriptors is completed.

18. The method of claim 14, further comprising storing status information in a first-in-first-out register, wherein the status information includes a field indicating whether one of the plurality of second descriptors is larger than a size of the first-in-first-out register.

19. The method of claim 14, wherein:

the first descriptor is a firmware descriptor; and the plurality of second descriptors are hardware descriptors.

20. The method of claim 14, further comprising:

executing firmware to generate the first descriptor; and generating, via an electronic circuit, the plurality of second descriptors according to the first descriptor.

* * * * *